United States Patent
Ono et al.

(10) Patent No.: US 7,835,171 B2
(45) Date of Patent: Nov. 16, 2010

(54) SEMICONDUCTOR MEMORY DEVICE

(75) Inventors: Kazuo Ono, Kodaira (JP); Riichiro Takemura, Los Angeles, CA (US); Tomonori Sekiguchi, Tama (JP)

(73) Assignee: Hitachi, Ltd., Tokyo (JP)

( * ) Notice: Subject to any disclaimer, the term of this patent is extended or adjusted under 35 U.S.C. 154(b) by 211 days.

(21) Appl. No.: 12/172,198

(22) Filed: Jul. 11, 2008

(65) Prior Publication Data

US 2009/0262568 A1 Oct. 22, 2009

(30) Foreign Application Priority Data

Jul. 19, 2007 (JP) ............... 2007-188328

(51) Int. Cl.
*G11C 11/00* (2006.01)
(52) U.S. Cl. .................. 365/148; 365/189.05; 365/203; 365/207; 365/210.1; 365/230.06
(58) Field of Classification Search ................. 365/148, 365/189.05, 203, 207, 210.1, 230.06
See application file for complete search history.

(56) References Cited

U.S. PATENT DOCUMENTS

2004/0100835 A1* 5/2004 Sugibayashi et al. ........ 365/200
2004/0114444 A1 6/2004 Matsuoka
2007/0127302 A1* 6/2007 Okamoto et al. ............ 365/210

FOREIGN PATENT DOCUMENTS

JP 2004-234707 A 8/2004

OTHER PUBLICATIONS

Kozicki et al., "Non-Volatile Memory Based on Sold Electrolytes," Non-Volatile Memory Technology Symposium 2004, Nov. 2004, pp. 10-17.
Sakamoto et al., "A Nonvolatile Programmable Solid Electrolyte Nanometer Switch", IEEE International Sold-State Circuits Conference, Feb. 2004, vol. 1.

* cited by examiner

*Primary Examiner*—Hoai V Ho
(74) *Attorney, Agent, or Firm*—Miles & Stockbridge P.C.

(57) ABSTRACT

A resistance variable memory reduces the nonuniformity of resistance values after programming, so that a rewrite operation can be performed on a memory cell at high speed. A reference resistor is connected in series with the resistance variable memory cell, and a sensor amplifier detects whether the potential at an intermediate node between the memory cell and the reference resistor exceeds a given threshold voltage, so as to stop the write operation based on a detection result.

18 Claims, 25 Drawing Sheets

LOW RESISTIVE STATE

HIGH RESISTIVE STATE

WRITING THE "0" STATE

WRITING THE "1" STATE

FIG.21A
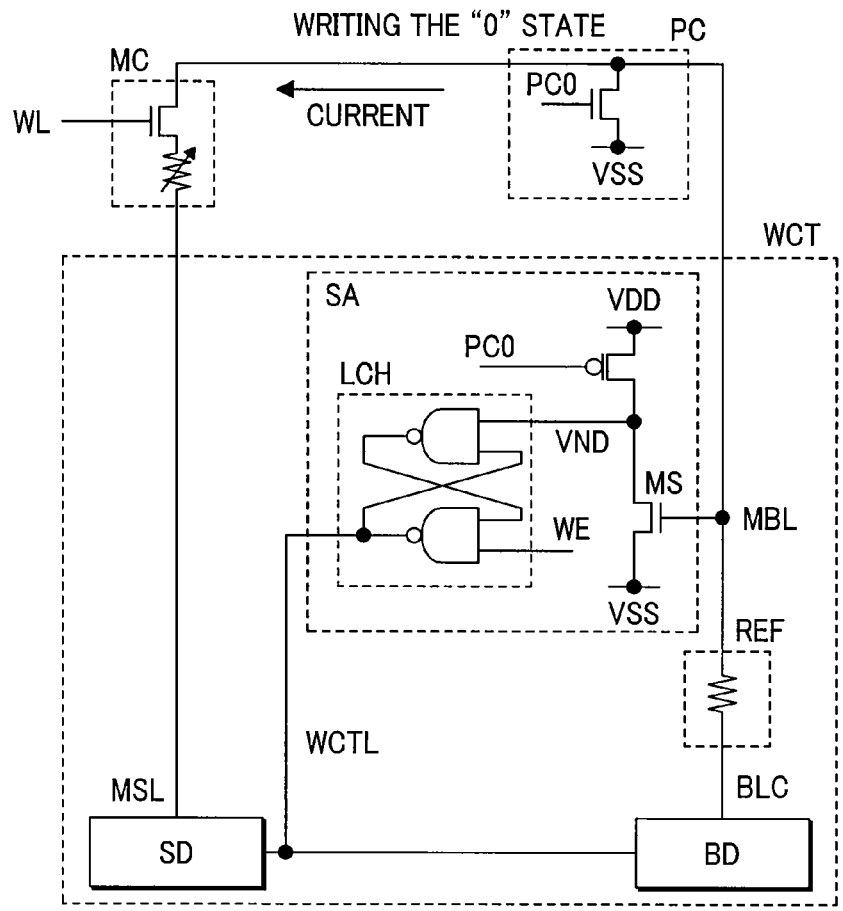
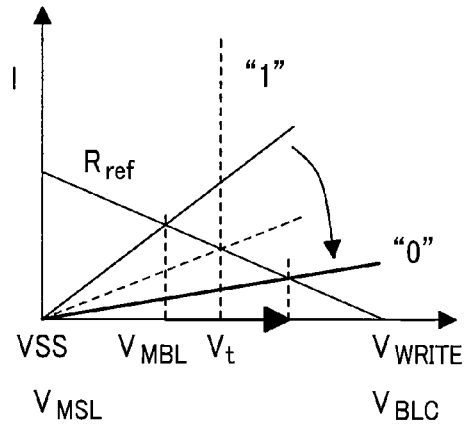
FIG.21B
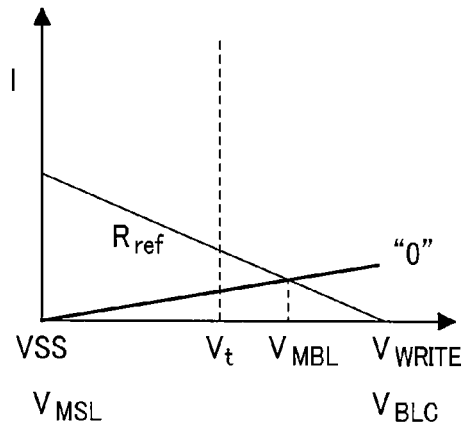
FIG.21C

CELL AREA = $6F^2$

SEMICONDUCTOR MEMORY DEVICE

CLAIM OF PRIORITY

The present application claims priority from Japanese patent application JP 2007-188328 filed on Jul. 19, 2007, the content of which is incorporated by reference into this application.

BACKGROUND OF THE INVENTION

1. Field of the Invention

The present invention relates to a semiconductor having a resistance variable memory cell, more specifically, to a technique that guarantees sure write operation of data at high speed.

2. Description of the Related Arts

While the miniaturization of high-integration dynamic random access memory (DRAM) cells is a dominant trend in design rule, it has not been easy to fabricate a capacitor that can guarantee a sufficient amount of signal. There has been an attempt to fabricate a resistance variable memory by configuring a memory cell with resistance variable elements, not capacitors, and correspondingly assigning a resistance value to logic information 0 or 1. Examples of the resistance variable memory include magnetic RAM (MRAM), phase change memory (PCM), resistive RAM (ReRAM), and solid electrolyte memory (which is proposed by Michael N. Kozicki, et al., in "Non-Volatile Memory Based on Solid Electrolytes", Non-volatile Memory Technology Symposium 2004, 15-17 Nov. 2004, p. 10-17, and T. Sakamoto et al., in "A Nonvolatile Programming Solid Electrolyte Nanometer Switch", Solid-State Circuits Conference 2004, Digest of Technical Papers. ISSCC 2004 IEEE International, 15-19 Feb. 2004, Vol. 1). MRAM uses the magnitude or value of tunnel current for writing data in it by using a magnetic material. PCM uses variation of resistance value occurring between a memory layer in amorphous state and a memory layer in crystal state for writing data in it. ReRAM uses a large variation of resistance value correspondingly to the direction of an applied voltage for writing data in it. Solid electrolyte memory has a structure where a solid electrolyte membrane made out of a compound of O, S, Se, and Te is inserted between upper and lower electrodes, and for writing data it uses a low-resistance state realized by forming a metallic conductive path in the solid electrolyte and a high-resistance state realized by losing the conductive path.

In a semiconductor memory device incorporating the resistance variable memory described above, a write operation in the low-resistance state and a write operation in the high-resistance state are carried out separately in different circuits. Moreover, a reference circuit used for deciding a potential during a write operation is connected in parallel to a bit line driver and a memory cell (refer to Japanese Patent Application Publication No. 2004-234707), for example.

SUMMARY OF THE INVENTION

For a resistive variable memory device performing a rewrite operation by flowing current, an overwrite operation to write the same data as the data already written makes the device unstable.

FIGS. 4A and 4B diagrammatically show an object to be resolved by the present invention. In FIG. 4A, the horizontal axis represents voltage (V) that is applied to a memory cell constituted by one MOS transistor shown in FIG. 4B and one resistance variable memory element, and the vertical axis represents resistance value of the memory cell. Those four curves shown in FIG. 4A illustrate, respectively, different characteristics observed in the same cell when ON state and OFF state were repeated. The arrow in the memory cell circuit diagram shown in FIG. 4B indicates the direction of current flowing in the device when the memory cell turns to a low-resistance state. The memory cell is characterized in that its resistance value goes down and "1" is programmed if voltage (V) exceeds a positive threshold voltage while the MOS transistor is in ON state, while its resistance value goes up and "0" is programmed if voltage (V) is below a negative threshold voltage while the MOS transistor is in ON state. As can be seen from the graph of FIG. 4B where the horizontal axis represents time and the vertical axis represents programming voltage, it is assumed that the applied voltage (V) to the memory cell has a triangular waveform or a staircase waveform.

For instance, logic value "1" defines the resistance value of a memory cell to be roughly 30 k$\Omega$, and logic value "0" defines the resistance value of a memory cell to be roughly 1 M$\Omega$. Suppose that an applied voltage is designated as an OFF voltage when the resistance value of the memory cell changes from 30 k$\Omega$ to 1 M$\Omega$ and that an applied voltage is designated as an ON voltage when the resistance value of the memory cell changes from 1 M$\Omega$ to 30 k$\Omega$. According to what is shown in FIG. 4A, the ON voltage and the OFF voltage do not behave uniformly during each of the four rewrite operations. It is believed that this phenomenon occurs because the ON voltage and the OFF voltage for a memory cell to carry out a rewrite operation are influenced by the resistance value of a previous memory cell. That is, if resistance values in "1" state are not even, rewrite voltages to "0" are not even. Similarly, if resistance values in "0" state are not even, rewrite voltages to "1" are not even. In effect, this nonuniformity of ON voltages and OFF voltages is expected to be more serious because memory device properties are not uniform among a plural number of memory cells as they are designed in small size. Because of this, a rewrite operation on a memory cell by impressing the same ON and OFF voltages to every memory cell results in variation in resistance value after the rewrite operation, so it is hard to be realized in a solid electrolyte memory.

FIGS. 5A and 5B diagrammatically show yet another object to be resolved by the present invention. In FIG. 5A, the horizontal axis represents ON voltage application time and OFF voltage application time and the vertical axis represents resistance value of a memory cell, showing a memory cell becoming programmed to the ON and OFF states. FIG. 5B shows an example of the configuration of the memory cell reflecting those characteristics. That is, the memory cell is constituted by one MOS transistor and one resistance variable memory element. In the circuit diagram of FIG. 5B, the arrow indicates the direction of current flowing in the memory cell when the memory cell turns to a low-resistance state. As shown in the graphs of time versus voltage in FIG. 5B, suppose that a fixed rewrite voltage Vwrite is impressed continuously to the memory cell. Also, suppose that logic value "1" defines the resistance value of a memory cell to be roughly 30 k$\Omega$, and logic value "0" defines the resistance value of a memory cell to be roughly 1 M$\Omega$. The straight lines C1 through C4 in FIG. 5A indicate that the amount of time taken to complete a rewrite operation is not uniform for every cell or for every rewrite operation, given that a memory cell has a resistance variable value in proportion to the write voltage application time. In general, the write voltage application time is fixed for a write circuit used in the conventional DRAM. In the case of the device as shown in FIGS. 5A and 5B, however, the resistance value after programming becomes highly non-uniform. A sure rewrite operation is realized only through a verify operation.

To resolve these objects, the present invention provides a semiconductor memory device of which write circuit detects whether or not the potential of the intermediate node between a memory cell and a reference load circuit exceeds the threshold voltage during the rewrite operation on the memory cell, so that the rewrite operation can be stopped if the potential exceeds the threshold voltage.

The write circuit for detecting an increase in the potential of the intermediate node to stop the write operation has a simple configuration, which is achieved by using a fact that the resistance value of the memory cell changes to a great deal between "1", state and "0" state.

With the memory featuring a large variation in resistance value of the memory cell between the logic value "1" and the logic value "0", the verify operation is done simultaneously with the rewrite operation, so that a sure data rewrite operation can be accomplished at high speed and the resistance non-uniformity of the memory cell during its operation is reduced even if a program voltage for the memory cell is not even.

BRIEF DESCRIPTION OF THE DRAWINGS

FIGS. 21A through 21C are operation explanatory views for the circuit in FIG. 7, in which a "0" state is written when the REF configuration of FIG. 11D is applied;

DETAILED DESCRIPTION OF THE PREFERRED EMBODIMENT

Figure 1A:
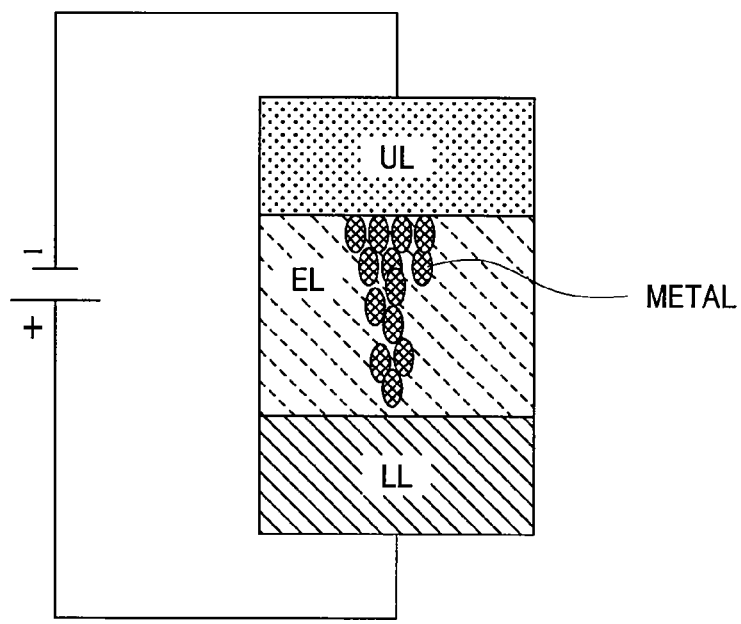
FIGS. 1A and 1B show, respectively, cross-sectional views of a solid electrolyte memory with a single memory layer in ON state and in OFF state.

Preferred embodiments of the present invention will now be described with reference to the accompanying drawings. Like components are designated by the same reference numerals throughout the drawings, and therefore the explanation of those components will be omitted hereafter.

Figure 5A:
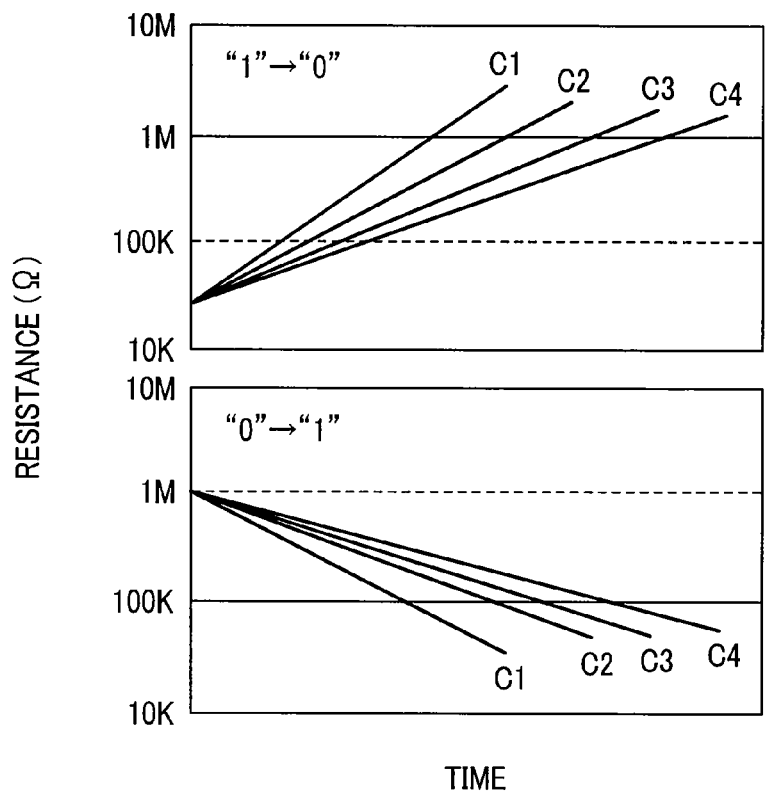
FIGS. 5A and 5B show, respectively, non-uniform time taken for switching of a solid electrolyte memory and examples of an applied voltage waveform.
Figure 5B:
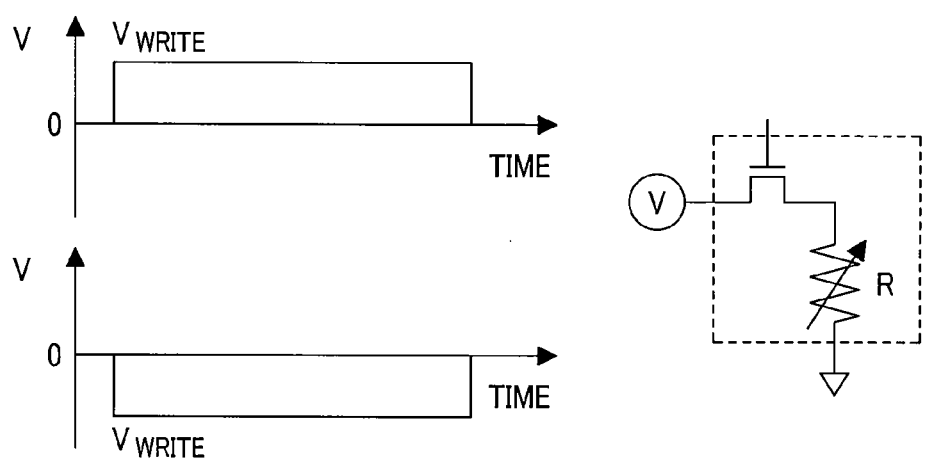
Figure 25A:
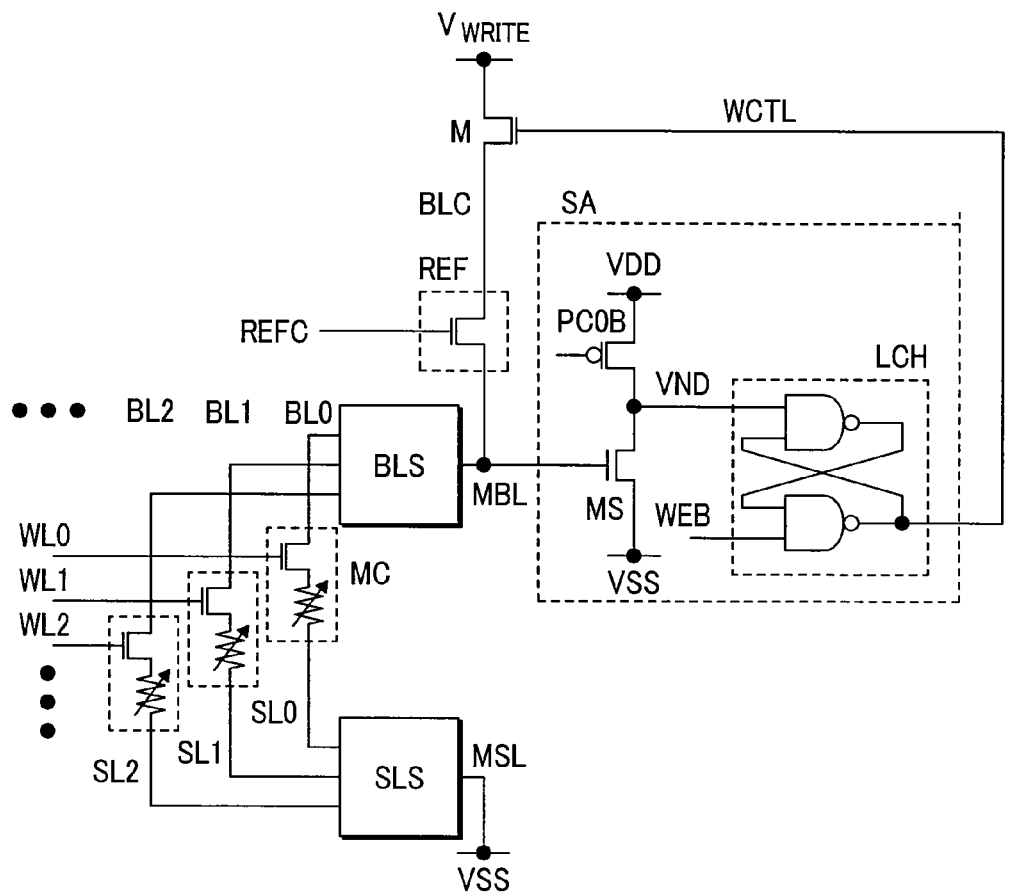
FIGS. 25A through 25C show, respectively, a circuit diagram according to one embodiment of the present invention, and a write operation explanatory view.
Figure 25B:
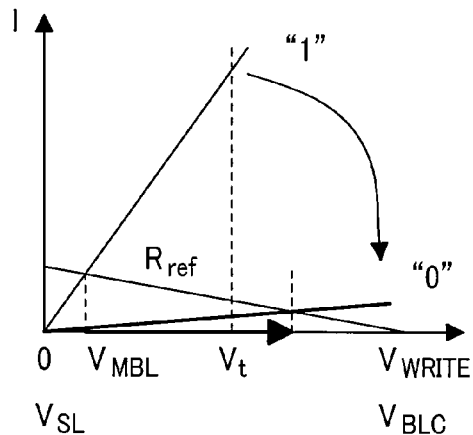
Figure 25C:
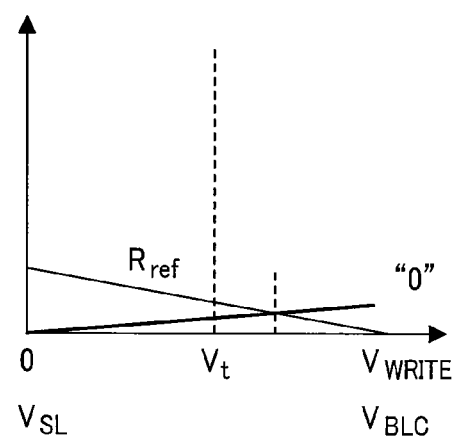

FIGS. 25A through 25C show a specific circuit configuration and a variation in resistance value of a memory cell MC during a rewrite operation. The memory cell used here is a resistance variable memory device that exhibits the current-voltage characteristics shown in FIGS. 3A and 3B. The memory cell turns into a high resistive state when current flows from a bit line BL to a source line SL and a potential difference between the bit line BL and the source line SL exceeds a positive threshold voltage, while it turns into a low resistive state when current flows from a source line SL to a bit line BL and a potential difference between the bit line BL and the source line SL exceeds a negative threshold voltage. Moreover, the memory cell, as shown in FIGS. 5A and 5B, has a resistance value that changes after programming according to the length of time to apply the program voltage Vwrite.

Figure 4A:
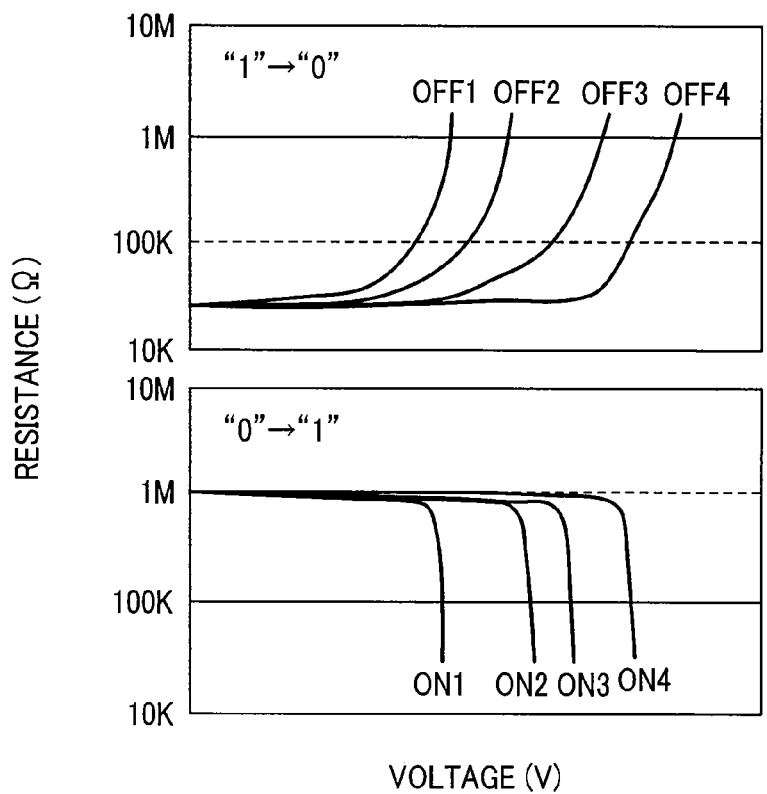
FIGS. 4A and 4B show, respectively, non-uniform switching voltage characteristics of a solid electrolyte memory and examples of an applied voltage waveform.
Figure 4B:
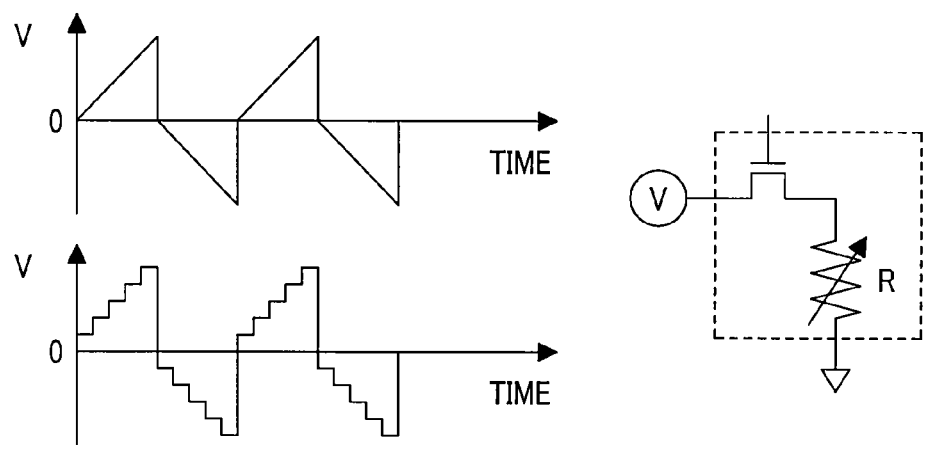

In FIG. 25B and FIG. 25C, the case where the memory cell MC is in a low resistive state is designated as "1", and the case where the memory cell MC is in a high resistive state is designated as "0". A bit line selector BLS selects one of plural bit lines BL and connects it to the main bit line MBL. A source line selector SLS selects one of plural source lines SL and connects it to the main source line MSL. The rewrite voltage Vwrite may be a fixed voltage such as 1V, a staircase waveform starting from a certain potential and going up, or a triangular waveform increasing monotonically. The waveform can also look like FIG. 4B or FIG. 5B. An arbitrary voltage waveform depending on the characteristics of a given memory cell MC may also be applied as the write voltage Vwrite. A signal for controlling the circuit includes a precharge signal PC0B and WEB, both being active low signals. A reference load circuit REF is constituted by a MOS transistor, and can control a resistance value by a gate voltage.

A programming operation by the above circuit will now be explained. In standby mode, the precharge signal PC0B goes Low, and a verify node VND is charged to VDD. After PC0B goes High and VND becomes floating, WCTL becomes High provided that WEB goes Low for a short period of time. Later, even after WEB returns to High, WCTL remains in a High state by a latch circuit LCH. When SCTL goes High, the MOS transistor M becomes ON, Vwrite is impressed to bit line control BLC, and a write operation starts.

First, a sequence of rewrite process at high resistance when MC is in a low resistive state will be explained. Right after the transistor M becomes ON, MC is in a low resistance state, so a potential of MBL VMBL determined by MC and REF resistance division is lower than the threshold voltage Vt of the MS, the MOS for sensing. Accordingly, MS is in OFF state.

When MC is rewritten in high resistance by continuously applying the rewrite voltage, VMBL increases correspondingly to the large resistance variation of MC, and MS becomes ON when VMBL>Vt. When MS becomes ON, the potential of the verify node VND becomes 0, causing WCTL to go Low. When WCTL goes Low, the transistor M becomes OFF and the supply of the rewrite voltage Vwrite stops, allowing no more rewriting. Therefore, the detected potential of the intermediate node VND of the memory cell MC and the reference load circuit REF is used for indicating that the MC has been rewritten at high resistance, and the write operation stops automatically. For a sufficient write operation, the relation between VMBL and Vt should be optimized. To this end, the reference load circuit REF is set to a suitable resistance value by the gate voltage.

According to the above-described rewrite method, it is possible to approximate the resistance value after programming to the resistance value determined by Vt and REF even when the memory cell's own rewrite threshold voltage and the threshold time required for rewriting are not uniform. Also, another advantage of the method is that the rewrite voltage does not need to be impressed for a longer period time than necessary, so the characteristics of the memory device are hardly changed or impaired. Moreover, since the verify operation is completed at the same time with the rewrite operation, the amount of time required for rewriting is shorter, compared with the traditional method alternately repeating the rewrite operation and the verify operation.

FIG. 25B graphically shows the variation of resistance of MC during a rewrite operation from low resistance to high resistance, in which the horizontal axis represents potential and the vertical axis represents current flowing in MC. The straight line "1" denotes that MC is in a low resistive state, while the straight line "0" denotes that MC is in a high resistive state. The straight line Rref is obtained by resistance values of the reference load circuit REF. Since a MOS transistor is used as the REF in FIG. 25A, it is not really a straight line. The same principle is applied to others such as diode or resistor element used as a load element for REF. The intersection point between the line "1" and the line Rref is a potential of MBL for starting the rewrite operation, and the intersection point between the line "0" and the line Rref is a potential of MBL after the rewrite operation. The graph shows that the MBL potential changes over time in the direction of an arrow on the x axis. The rewrite operation from high resistance to low resistance is done equally by flowing current into the opposite direction using a switch.

Referring to FIGS. 25A and 25B, the following will now explain a sequence of the high resistance write process if the high resistance state is stored in MC. To begin with, PC0B goes Low and the verify node VND is charged. Then, PC0B goes High to make the VND in floating state. When WEB is Low, WCTL becomes High. Even when WEB becomes High later, WCTL remains in High state by LCH. When WCTL is High, M is in ON state and the rewrite voltage Vwrite is supplied to BLC. If MC is in a high resistive state, the potential at the node MBL exceeds Vt immediately after the write operation begins. Thus, MS should be in ON state right after M becomes ON. As a result, WCTL goes Low and M becomes OFF. Because the time for flowing a rewrite current is minimized, overwrites of "0" on the MC already being in a "0" state can be avoided. Avoiding overwrites is an important goal for the resistance variable memory. Fortunately, this goal can be achieved by the write method described above.

FIG. 25C shows the resistance of MC in the case of writing "0" on "0". Since MC is already in the "0" state from the beginning of the write operation, it does not undergo any more change in the resistance. The same operation is realized when the rewrite operation is carried out from low resistance to low resistance.

Figure 1B:
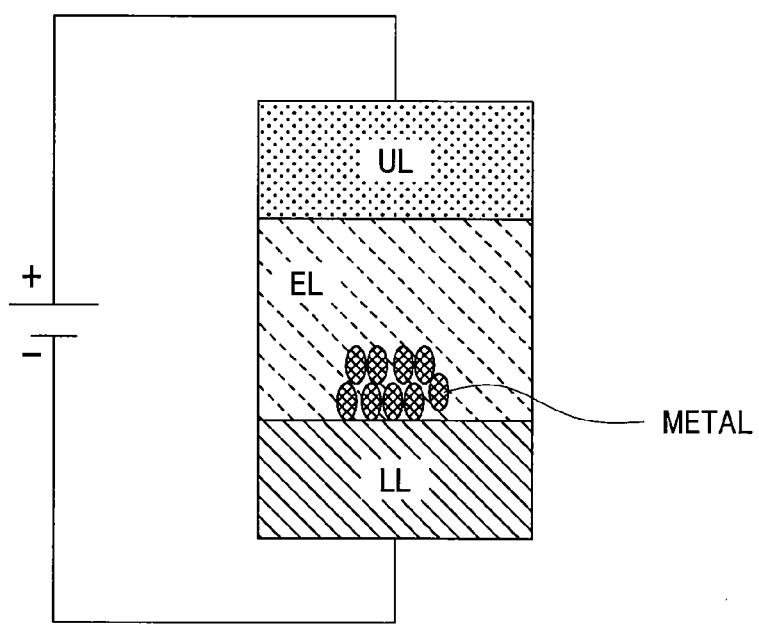

FIGS. 1A and 1B show one example of the cross-section of a memory cell MC in a solid electrolyte memory constituting the present invention. An upper electrode UL is made of a metal typically used for writing, such as, tungsten (W) or a tungsten-titanium alloy (WTi). A solid electrolyte layer EL is a compound of sulfur (S), selene (Se), and tellurium (Te). A lower electrode LL is made of a metal such as silver (Ag) or copper (Cu), but this is for illustrative only and any suitable metal may be chosen based on the operation voltage or the kind of solid electrolyte being used. By irradiating ultraviolet light or applying heat in the course of manufacture, metal ions are diffused from the lower electrode LL to the solid electrolyte layer EL, so that the metal ions can be included in the solid electrolyte layer.

FIG. 1A diagrammatically shows a state, in which a negative voltage is impressed to the upper electrode UL of a device, a positive voltage is impressed to the lower electrode LL of the device, and a metal conductive path is formed in the solid electrolyte layer, thereby creating a low resistive state. FIG. 1B diagrammatically shows a state, in which the direction of an applied voltage is inversed to oxidize and ionize the metal forming the conductive path, thereby causing the conductive path to disappear and creating a high resistive state. In short, the solid electrolyte memory controls the resistance state of a memory device by using the oxidation-reduction reaction of metal ions.

Figure 2A:
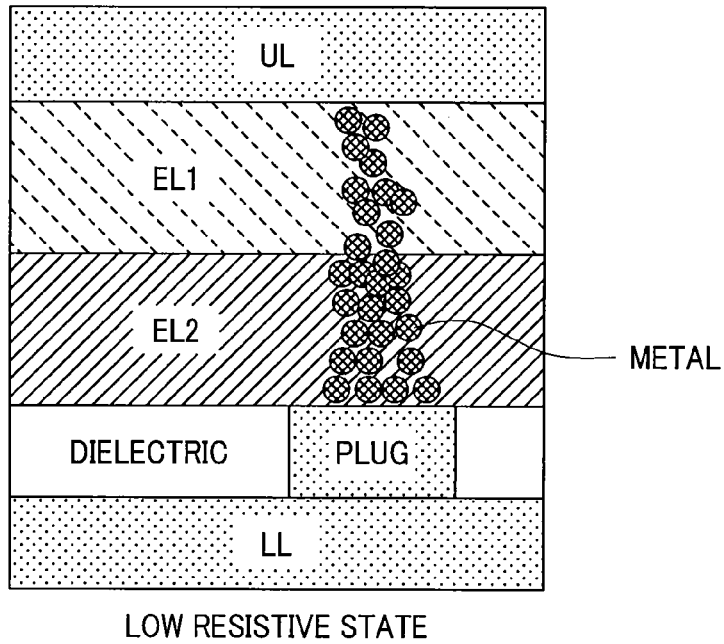
FIGS. 2A and 2B show, respectively, cross-sectional views of a solid electrolyte memory with double memory layers in ON state and in OFF state.
Figure 2B:
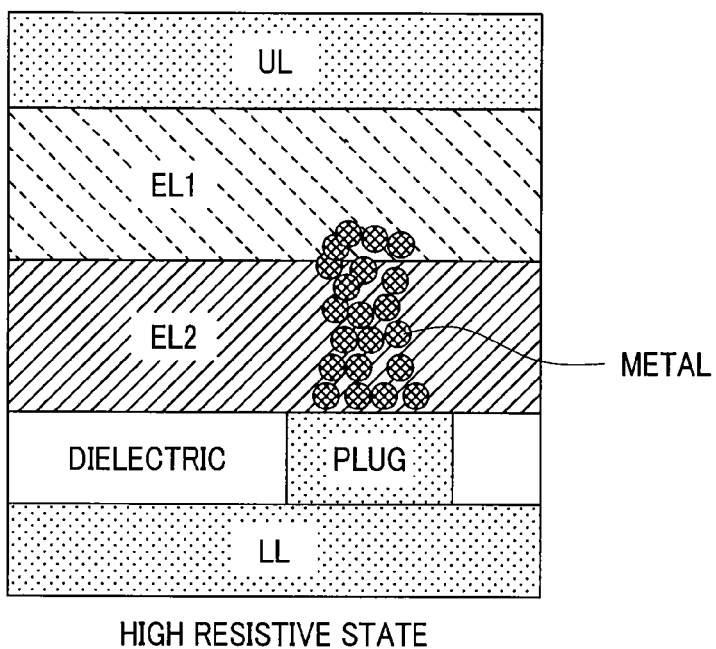

FIG. 2 shows one example of the cross-section of a solid electrolyte memory having double write layers. An upper layer UL is made of a metal typically used for wiring, such as W or WTi. A solid electrolyte layer 1 and a solid electrolyte layer 2 have different compositions, EL1 is a supply source of metal ions forming a conductive path, and EL2 is an insulation film. To form a conductive path, metal ions are diffused from the solid electrolyte EL1 used as the ion supply source, and a potential required for programming is supplied between the upper electrode UL and the lower electrode LL. The lower electrode is formed into a plug shape to restrict the area used for forming the conductive path, but is not limited thereto.

Figure 3A:
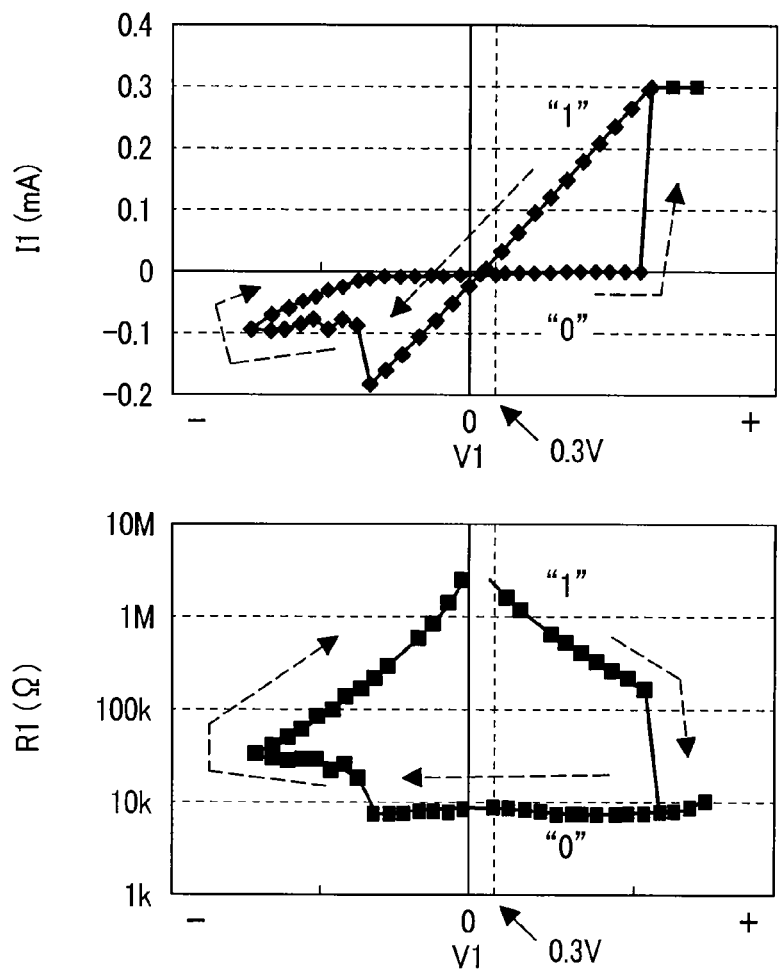
FIGS. 3A and 3B show, respectively, experiment data and an example of experiment layout to find out DC current versus voltage characteristics of a solid electrolyte memory.
Figure 3B:
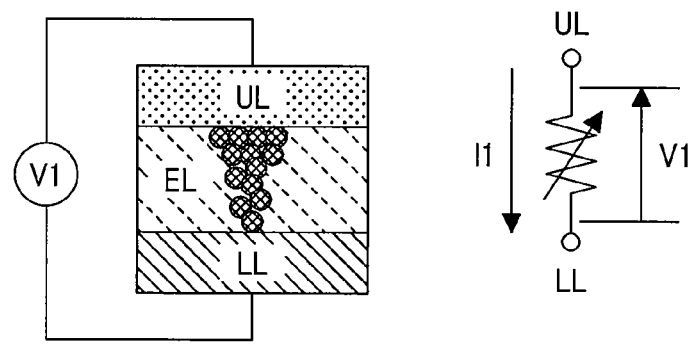

FIG. 3A shows the relationship between the voltage V1 at both ends of the upper and lower electrodes UL and LL and the current I1 flowing from UL to LL, provided that a solid electrolyte layer EL is inserted between the upper electrode UL and the lower electrode LL of a solid electrolyte memory as illustrated in FIG. 3B. In the circuit diagram of FIG. 3B, arrows point out the positive direction of I1, the positive direction of V1, and the current direction when a resistive variable memory device is in low resistive state, respectively. For a device exhibiting the characteristics similar to ones in FIG. 3A, logic value "1" designates a low resistive state, logic value "0" designates a high resistive state, ON voltage designates a voltage changing from the high resistive state to the low resistive state, and OFF voltage designates a voltage changing from the low resistive state to the high resistive state. For example, if the read voltage is set to 0.3V which is sufficiently low compared with the ON and OFF voltages, more than two digits of the resistance ratio of the low resistance state to the high resistance state is guaranteed.

For such a solid electrolyte memory having the above-described characteristics, the present invention makes use of the facts that the resistance ratio of the low resistive state to the high resistive state is more than 1 digit number and that the current flowing in the memory device when the rewrite operation has been carried out varies to a great deal. Therefore, the present invention technique can be applied particularly to a memory cell showing a large variation of resistance (more than 1 digit number) among resistance variable memories.

Figure 6A:
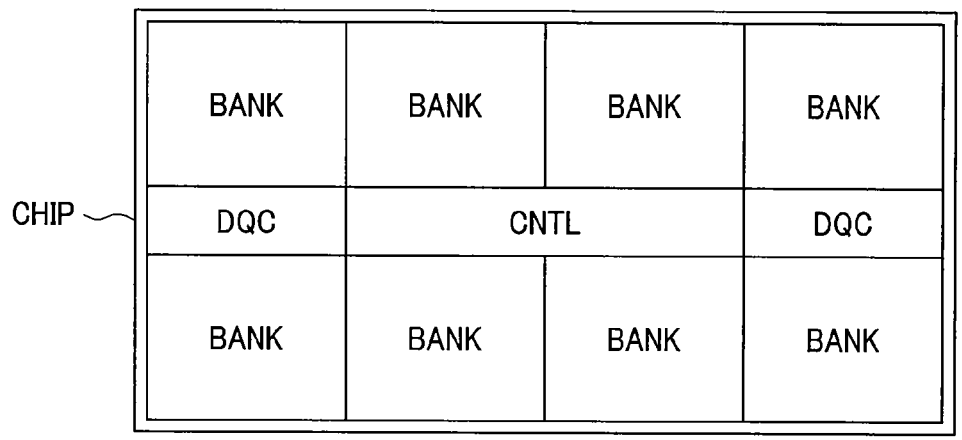
FIGS. 6A and 6B show, respectively, a memory chip provided by the present invention, and an example of the configuration of BANK in the memory chip according to the present invention.
Figure 6B:
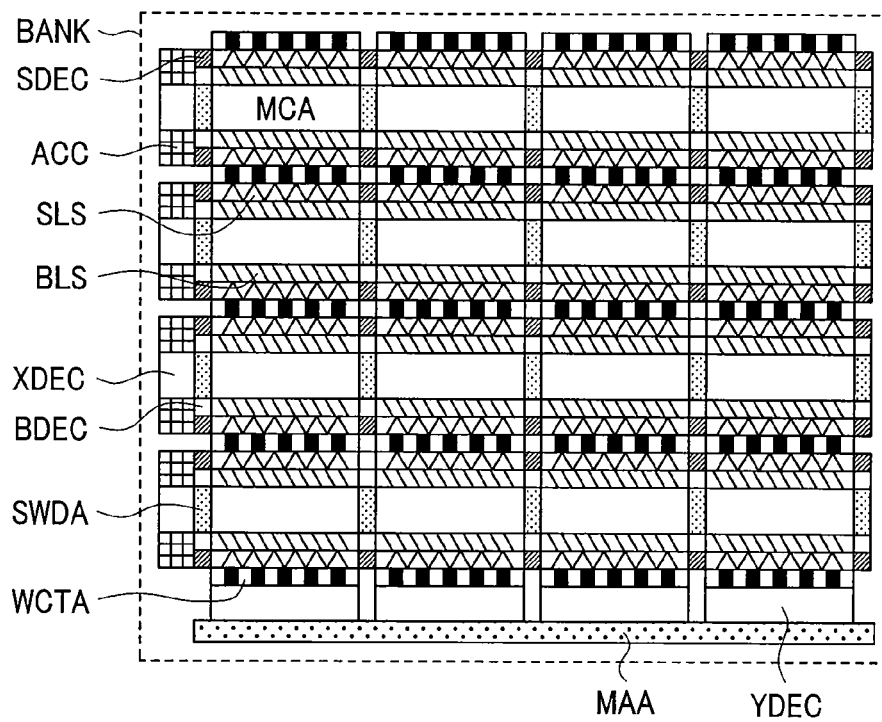

FIGS. 6A and 6B are schematic plan views showing one example of the chip configuration incorporated into a semiconductor memory device, in accordance with one embodiment of the present invention. FIG. 6A is a schematic view of the entire chip, and FIG. 6B is a schematic view of a memory bank in FIG. 6A.

The semiconductor memory device depicted in FIGS. 6A and 6B is constituted by a solid electrolyte memory. As shown in FIG. 6B, the configuration of a memory chip is largely divided into a control circuit CNTL, an I/O circuit DQC, and a memory bank BANK. The control circuit CNTL receives clock, address and control signals from the outside of the memory chip CHIP, and it decides an operation mode of the memory chip CHIP or carries out an address prerecording, etc. The I/O circuit DQC includes an I/O buffer, etc., and receives write data from outside and outputs read data to the outside of the memory chip CHIP.

The memory bank BANK includes plural memory arrays MCA arranged as shown in FIG. 6B, and around them is a sub-word driver array SWDA, a bit line selector BLS, a bit line decoder BDEC, a source line selector SLS, a source line decoder SDEC, and a write circuit array WCTA. On the periphery of the memory bank BANK, an array decoder YDEC and a main amplifier array MAA are arranged in parallel to a rewrite circuit array WCTA, and a row decoder XDEC and an array control circuit ACC are arranged in parallel to a sub-word driver array SWDA.

Figure 7:
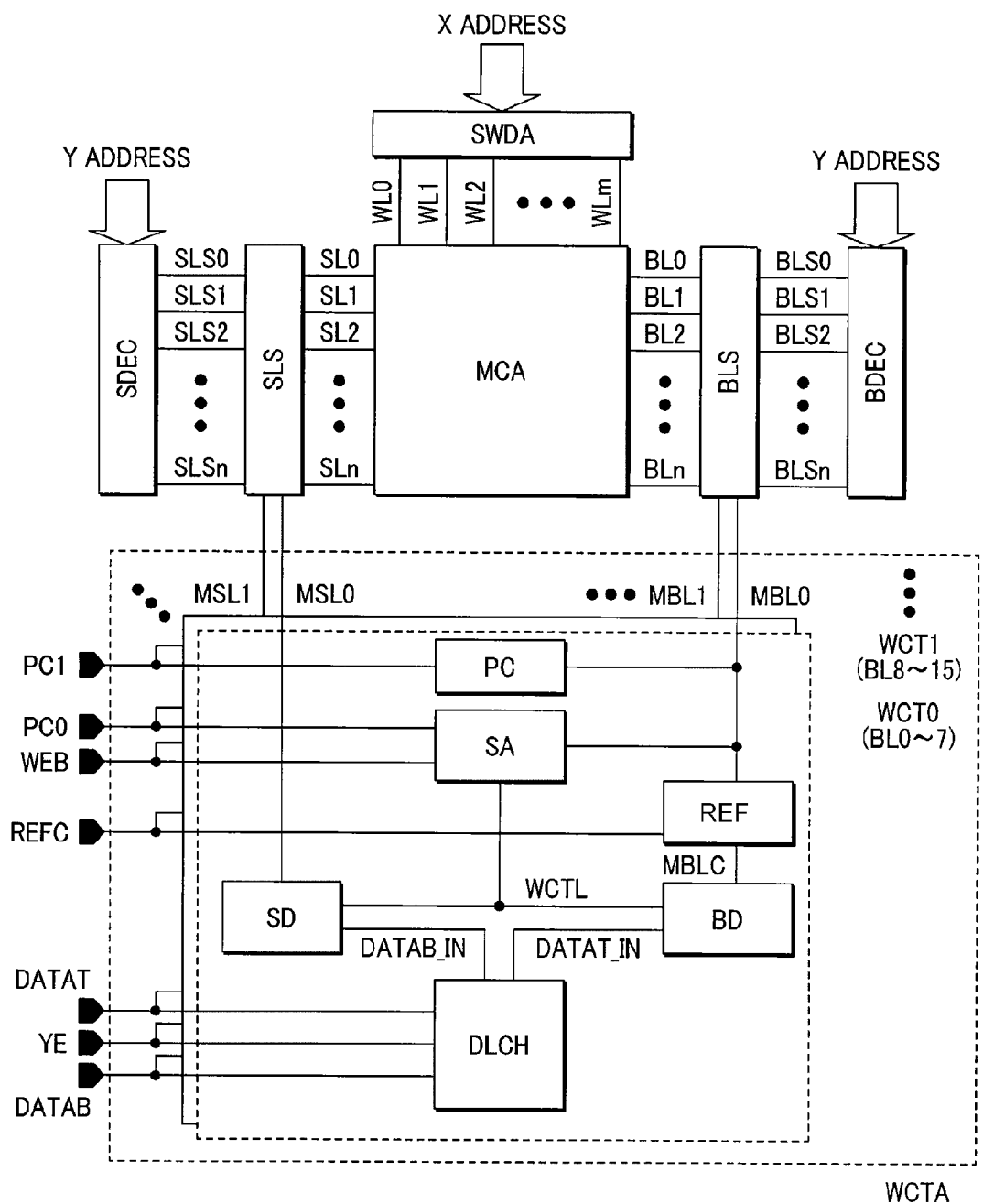
FIG. 7 shows a schematic view of the whole circuitry embodied in the present invention.

FIG. 7 illustrates the entire circuit embodied in the present invention. The sub-word driver array SWDA, the bit line selector circuit BLS, and the source line selector circuit SLS are connected to the memory cell array MCA. WL0, WL1, WL2, . . . , and WLm denote word lines, BL0, BL1, BL2, . . . , and BLn denote bit lines, and SL0, SL1, SL2, . . . , and SLn denote source lines. The bit line selector BLS and the source line selector SLS select a rewrite target memory cell out of the MCA, and are connected to the verify rewrite circuits WCT0, WCT1, . . . , and WCTk through the main bit lines MBL0, MBL1, . . . , and MBLk and the main source lines MSL0, MSL1, . . . and MSLk. For instance, BL0 to BL7 and BL8 to BL15 are connected to WCT0 and WCT1, respectively, such that several BLs are connected to WCT by BLS. Here, m, n, and k are integers and have different values from one another, depending on the number of memory cells or WCTs included in MCA. BLS is connected to the bit line decoder BDEC through the bit line selector BLS, and SLS is connected to the source line decoder SDEC through the source line selector SLS. An X address signal being decoded at XXDEC enters the sub-word driver array SWDA to drive a designated word line WL. Y addresses being decoded at the Y decoder YDEC enter the bit line decoder BDEC and the source line decoder SDEC, and are used to select the bit line selector BLS and the source line selector SLS, respectively.

The verify rewrite circuit WCT is constituted by a pre-charge circuit PC, a sense amplifier SA, a reference load circuit REF, a bit line driver BD, a source line driver SD, and a data latch circuit DLCH. PC is connected to MBL and controlled by a precharge control signal PC1. SA is connected to MBL, BD, and SD, and controlled by a precharge control signal PC0 and a write enable signal WEB. REF is a variable resistance, if a MOS resistance is assumed, to be able to vary the resistance value by the gate voltage. REF is inserted between MBL and the main bit line control MBLC, and it is inserted in series between the memory cell and the path used for flowing the write current.

Figure 24A:
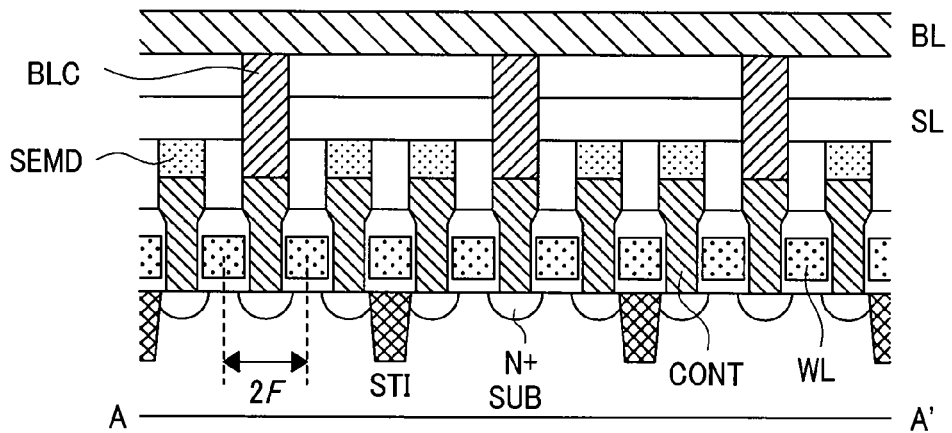
FIGS. 24A through 24C show, respectively, examples of a cross-sectional structure of a memory array taken along line A-A' of FIG. 23, in which the memory array is formed at a layer with a bit line above a source line and at a layer with a bit line below a source line.
Figure 24B:
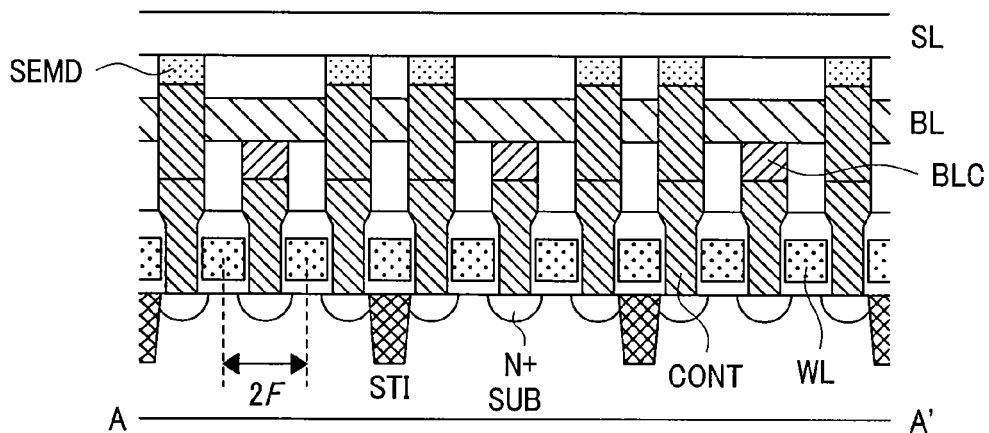
Figure 24C:
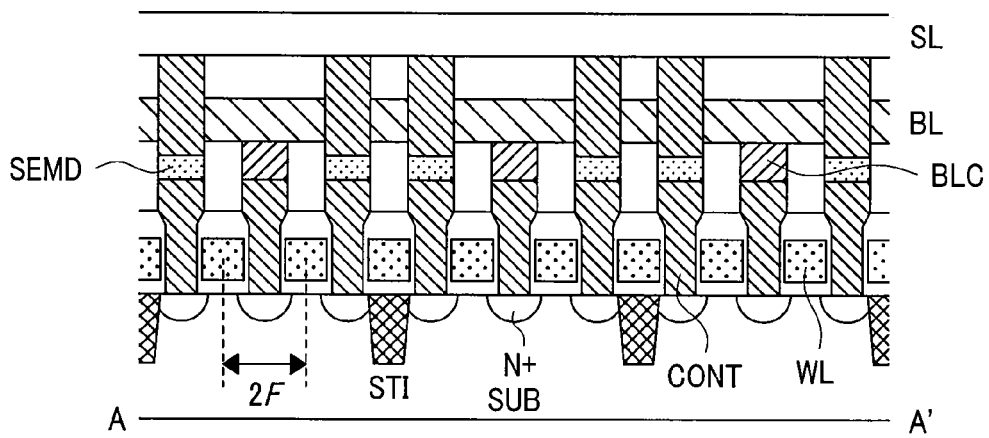

As explained in FIGS. 24A through 24C, the sense amplifier SA detects whether the potential at the intermediate node between the memory cell and REF exceeded the threshold voltage, and controls BD and SD through the write control node WCTL. DLCH is a circuit for latching data during the write operation. Write data is input from DATA and controlled by Y address enable YE. Write data is input from DATAT_IN, and inverted write data is input from DATAT_IN. The latched data is sent to BD by DATAT_IN, and the latched inverted data is sent to SD by DATAB_IN. If the write data is "1", VSS and write voltage Vwrite are impressed to SL and BL, respectively, to put the memory cell in a low resistive state. Meanwhile, if the write data is "0", VSS and write voltage Vwrite are impressed to SL and BL, respectively, to put the memory cell in a high resistive state.

Figure 8:
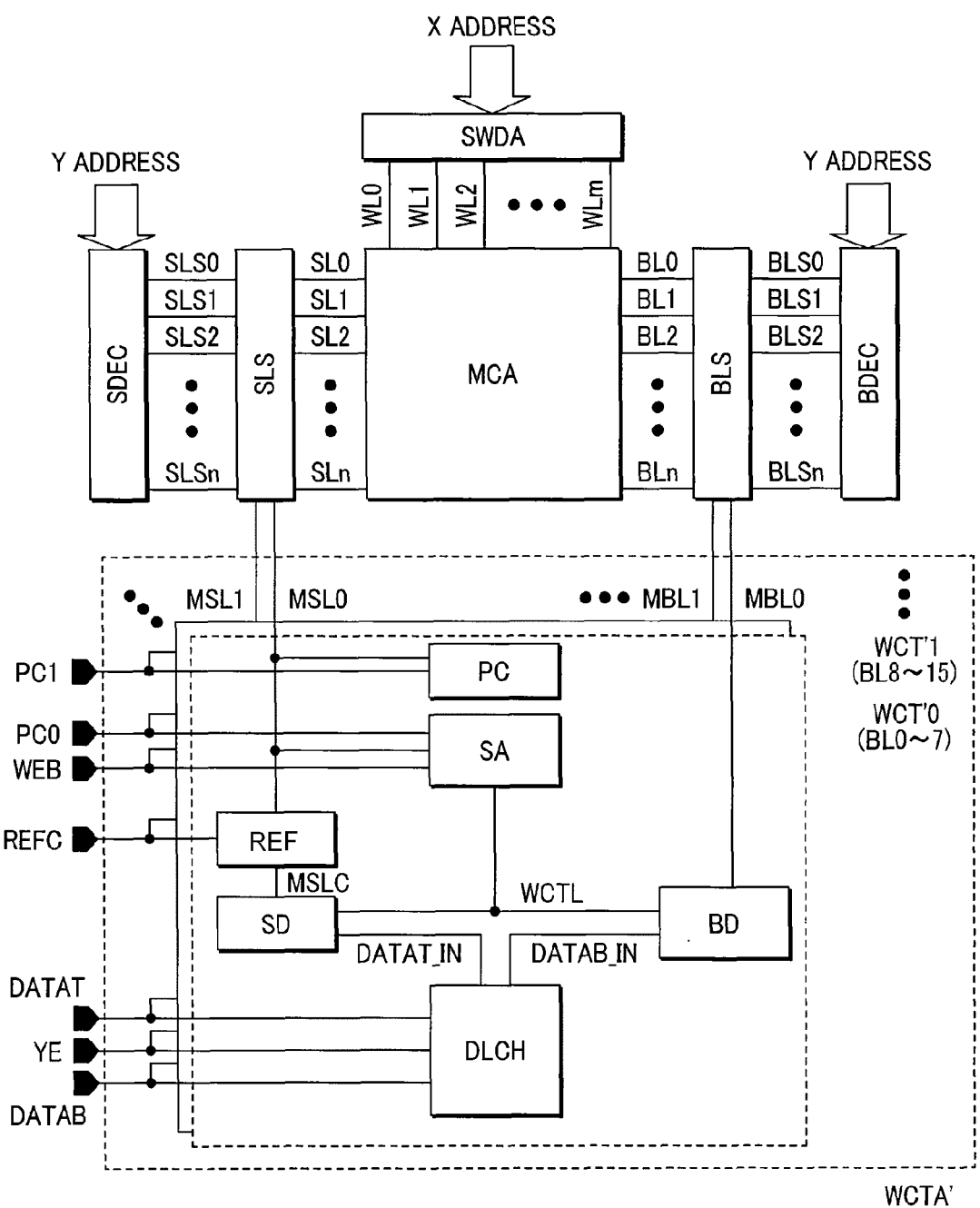
FIG. 8 shows another schematic view of the whole circuitry embodied in the present invention.

FIG. 8 illustrates a second embodiment of the present invention. This differs from FIG. 7 in aspect of the configuration of a write circuit WCT'. That is, PC and SA are connected to MSL, REF is connected between MSL and the main source line control MSLC, DLCH and BD are connected by DATAB_IN, and DLCH and SD are connected by DATA-T_IN.

Figure 9:
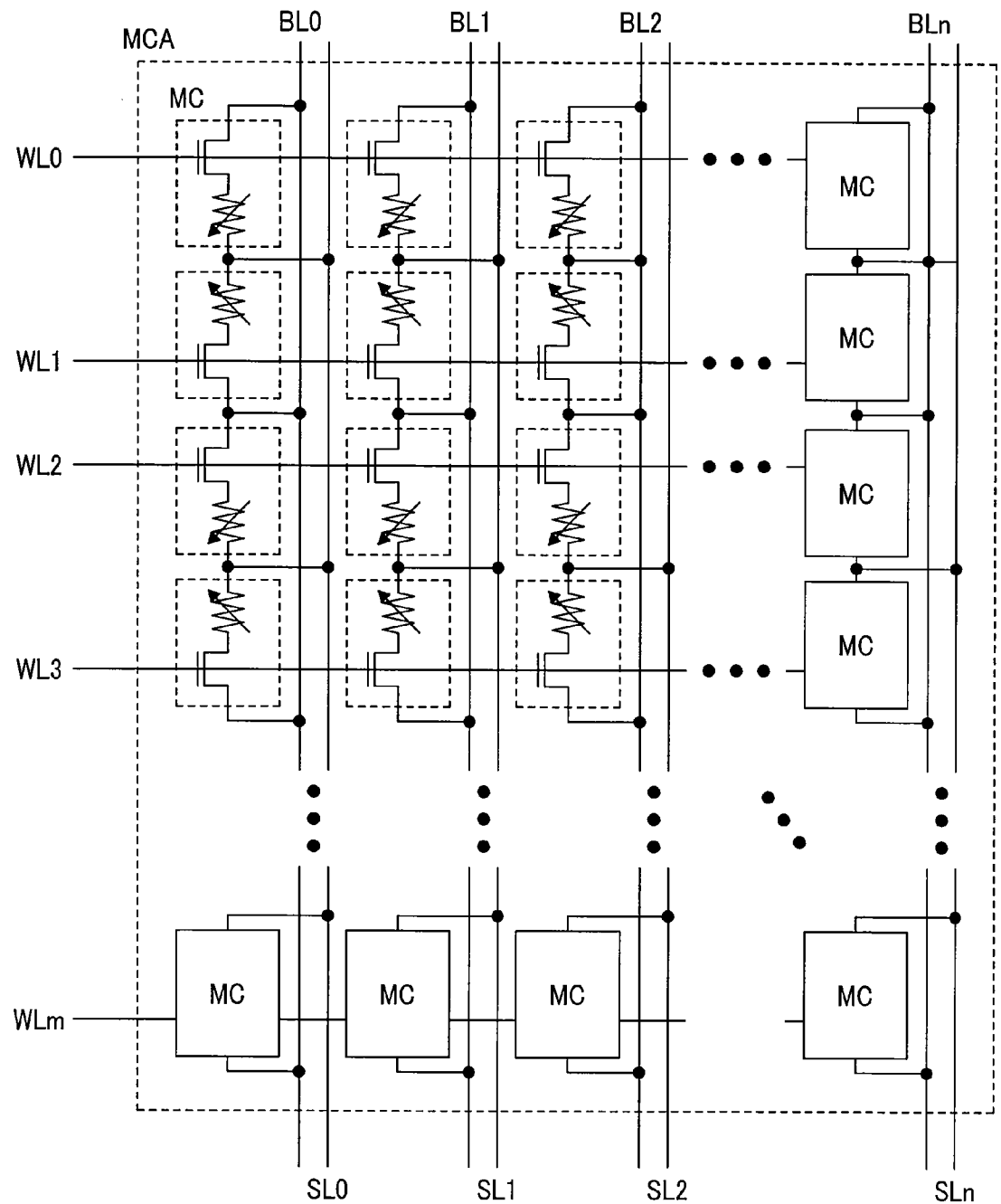
FIG. 9 shows an example of the configuration of a memory array.

FIG. 9 shows one example of the configuration of a memory cell array MCA. A memory cell MC is arranged at each intersection point between word line WL and bit line BL, forming an m×n matrix. One MC is constituted by one MOS transistor and one resistance variable memory element. A gate of the MOS transistor is connected to WL, a source of the MOS transistor is connected to the resistance variable memory element, and a drain of the MOS transistor is connected to BL. As has been defined in FIGS. 3A through 5B, the arrow in the circuit diagrams indicates the direction of current flowing in a memory cell when a rewrite operation is performed on the memory cell in a low resistive state.

Figure 10A:
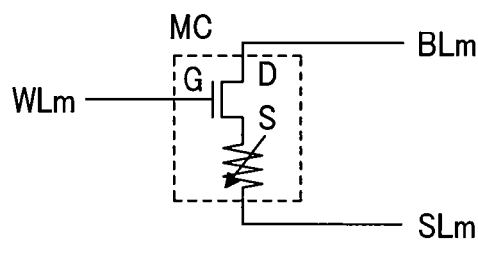
FIGS. 10A through 10D show, respectively, memory cells.
Figure 10B:
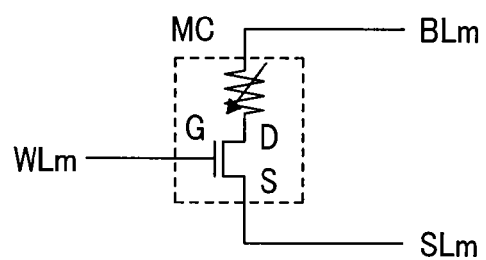
Figure 10C:
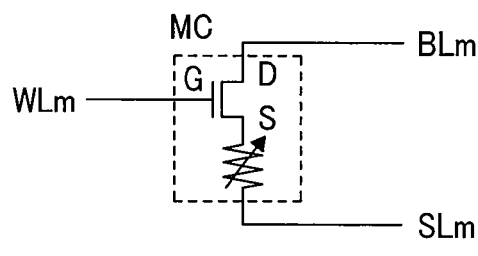
Figure 10D:
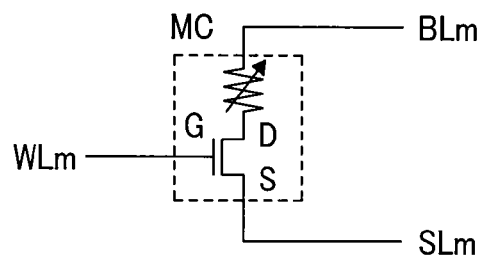

FIGS. 10A through 10D enumerate examples of MC. A gate of the transistor was designated as G, a source S, and a drain D. In FIG. 10A, the gate, the drain, and the source are connected to WL, BL, and the resistance variable memory device, respectively, and the memory device is arranged in a manner that it becomes low resistive when current flows from BL to SL. In FIG. 10B, the gate, the source, and the drain are connected to WL, SL, and the resistance variable memory device, respectively, and the memory device is arranged in a manner that it becomes low resistive when current flows from BL to SL. In FIG. 10C, the gate, the source, and the drain are connected to WL, the resistance variable memory device, and BL, respectively, and the memory device is arranged in a manner that it becomes low resistive when current flows from SL to BL. In FIG. 10D, the gate, the source, and the drain are connected to WL, SL, and the resistance variable memory device, respectively, and the memory device is arranged in a manner that it becomes low resistive when current flows from SL to BL.

Figure 11A:
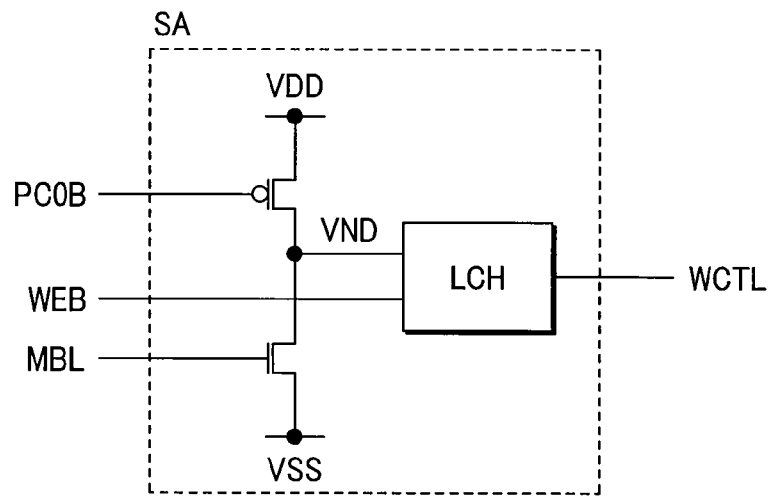
FIGS. 11A through 11E show, respectively, an example of sense amplifier, an example of a latch circuit, a reference resistance circuit, and a bit line precharge circuit.

FIGS. 11A through 11E show examples of the write circuit (WCT and WCT') configuration. In detail, FIG. 11A depicts one example of SA. There is PMOS for charging the verify node VND to VDD, under the control of a precharge signal PC0B. PC0B is an active low signal. NMOS is arranged between VND and 0V to do switching, depending on potential at the main bit line. VND is connected to LCH, the circuit for latching the write state. LCH is controlled by a write enable signal WEB. WEB is an active low signal. An output from LCH is a write control node WCTL, and this becomes the output of SA as it is. Since the resistance value of the memory cell MC of the present invention changes more than one digit number, the potential at MBL increases greatly when the rewrite is completed.

Figure 11B:
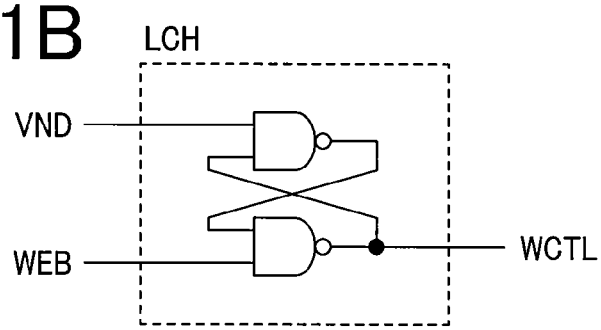

FIG. 11B depicts one example of LCH. This is a standard SR latch circuit using two NAND gates. VND denotes an input (1), WEB denotes an input (2), and WCTL denotes an output (2). LCH is not limited to the circuit shown in FIG. 11B, but it can be one as long as it latches WCTL=High when WEB is in OFF state and VND is VDD and is capable of invert an output of WCTL when VND changes to 0.

Figure 11C:
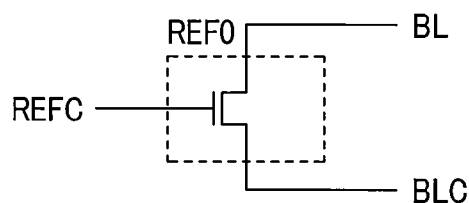
Figure 11D:
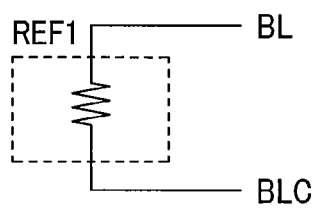

FIG. 11C and FIG. 11D depict examples of a reference resistance REF. FIG. 11C uses a MOS transistor as the load, and FIG. 11D uses a fixed resistance by polysilicon. One of advantages of using the MOS transistor is that the resistance value can be controlled by a gate voltage. In the case of using a fixed resistance by polysilicon, the resistance value is stabilized so a circuit of high reliability can be designed.

Figure 11E:
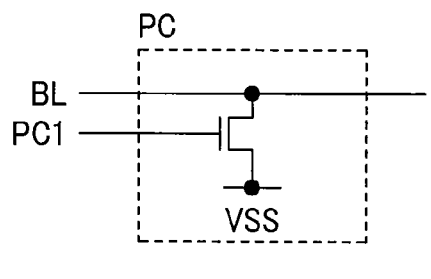

FIG. 11E depicts a ground circuit of the bit line. This removes accumulated charge at the parasitic capacitance of a bit line after the rewrite is completed.

Figure 12A:
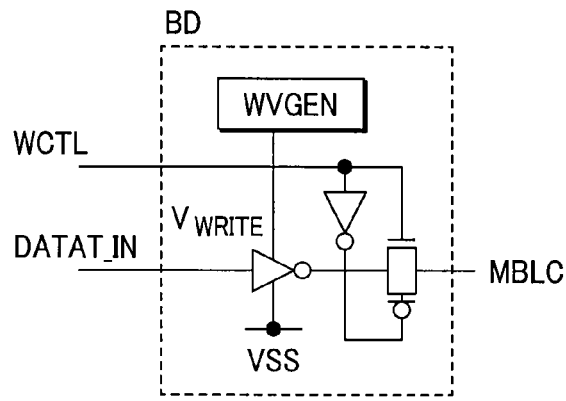
FIGS. 12A through 12C show, respectively, a bit line driver circuit, a source line driver circuit, and a data latch circuit.

FIG. 12A illustrates a case that all word lines are driven from the sub-word driver array arranged at one side of a memory cell array, but it is also possible to arrange sub-word drivers to be half of the number of WLs so that the SWDAs on each side of the memory cell array are responsible for driving half of the word lines. In such a sub-word driver array SWDA, pitch of SWD can be broadened to increase the degree of freedom of layout.

Figure 12B:
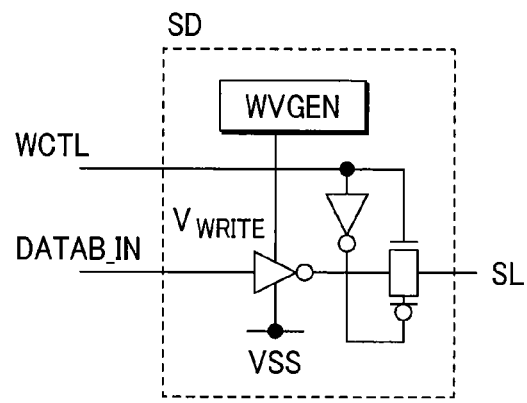

FIG. 12B depicts one example of the bit line driver BD shown in FIG. 7. Data being latched by the data latch circuit DLCH is input to BD by DATAT_IN. In the case of writing "0", a rewrite voltage Vwrite is impressed to the main bit line control BLC by the rewrite voltage generation circuit WVGEN, such that the memory cell becomes high resistive. Vwrite varies depending on the characteristics of a resistance variable memory device arranged at the memory cell. In the case of writing "1", on the other hand, VSS is impressed to the main bit line control MBLC to make the memory cell become low resistive. The potential at the main bit line control MBLC is controlled by a rewrite control signal WCTL generated from SA illustrated in FIG. 11A.

Figure 12C:
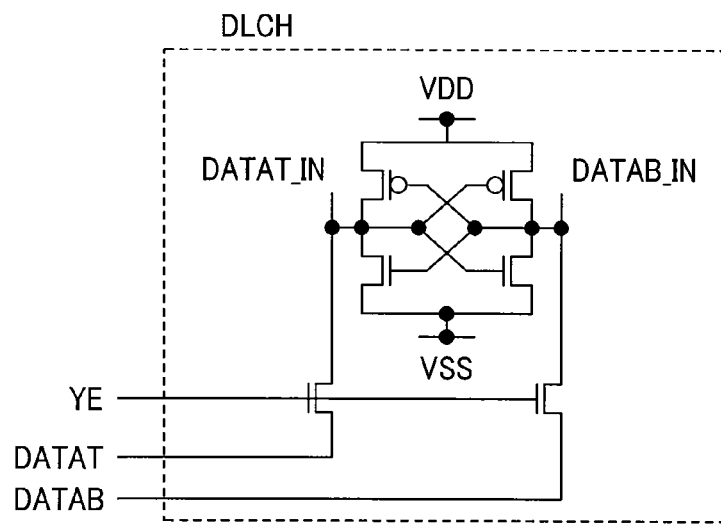

FIG. 12C shows one example of the source line driver SD shown in FIG. 7. Data being latched by the data latch circuit DLCH is input to SD by DATAT_IN. In the case of writing "0", VSS is impressed to the main source line MSL to make the memory cell become high resistive. In the case of writing "1", on the other hand, a rewrite voltage Vwrite is impressed to the main source line MSL by the rewrite voltage generation circuit WVGEN, such that the memory cell becomes low resistive. Vwrite varies depending on the characteristics of a resistance variable memory device arranged at the memory cell. The potential at the main source line MSL is controlled by a rewrite control signal WCTL generated from SA illustrated in FIG. 11A.

FIG. 12D shows one example of the data latch circuit DLCH. The rewrite data is input to DLCH by DATAT, while the inverted rewrite data is input to DLCH by DATAB. Once a Y address is determined by the Y decoder, YE should be High for the write data to be latched.

Figure 13:
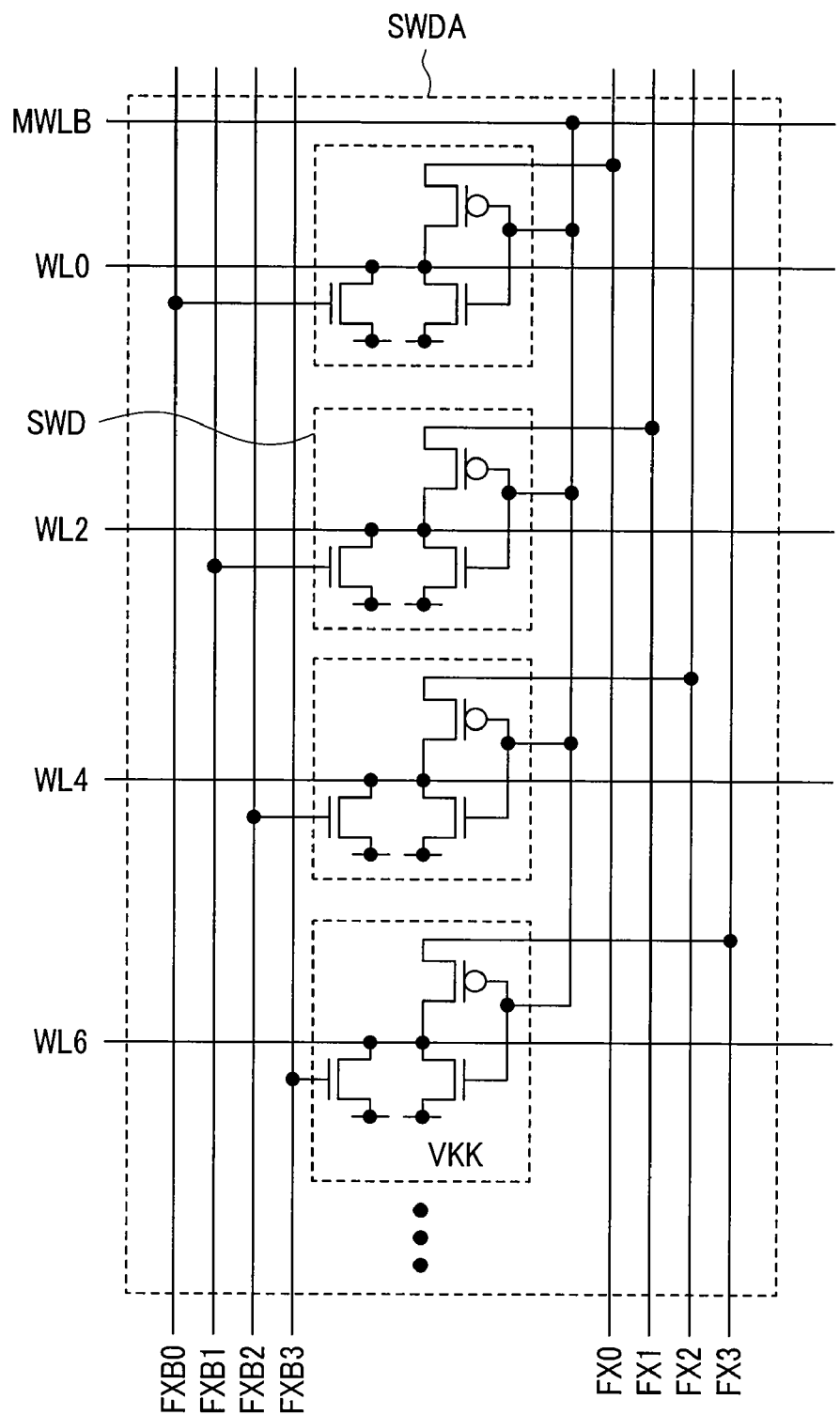
FIG. 13 shows a sub-word driver array circuit.

FIG. 13 shows one example of the sub-ward driver array SWDA. As shown in FIG. 6B, SWDA is arranged around the memory cell array MCA. In order to drive word lines WL of the memory cell array MCA from the sub-word driver array SWDA at one of both sides, the number of sub-word drivers included in the sub-word driver array at one side may be just half of the number of word lines WL included in the memory cell array MCA. The sub-word driver SWD is constituted by one PMOS and two NMOSs. The PMOS has a gate connected to the main word line MWLB, a source connected to the sub-word driver selector line FX, and a drain connected to the word line WL. One of the NMOS has a gate connected to the main word line, a source connected to a negative voltage VKK that is equal to or lower than VSS, and a drain connected to the word line WL. The other NMOS has a gate connected to an inverted sub-word driver selector line FXB, a source connected to VKK, and a drain connected to the word line WL.

Figure 14A:
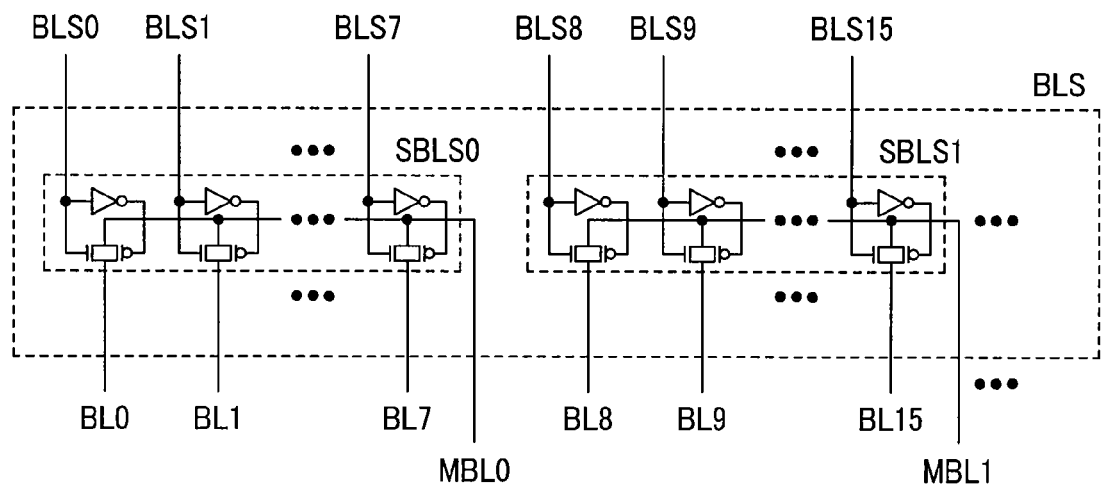
FIGS. 14A and 14B show, respectively, a bit line selector circuit and a source line selector circuit.

FIG. 14A shows one example of the configuration for the bit line selector BLS circuit shown in FIG. 7. When the bit line selector BLS is selected by the bit line decoder BDEC, the bit line BL connected to a corresponding sub-bit line selector SBLS is selected and connected to the main bit line MBL. In this example, one main bit line MBL is selected for eight bit lines BL. Here, the number of bit lines BL is not limited to 8, so a variety of numbers such as 4, 2, 16, etc., can be considered. This configuration is suitable for the multi-bit rewrite at once.

Figure 14B:
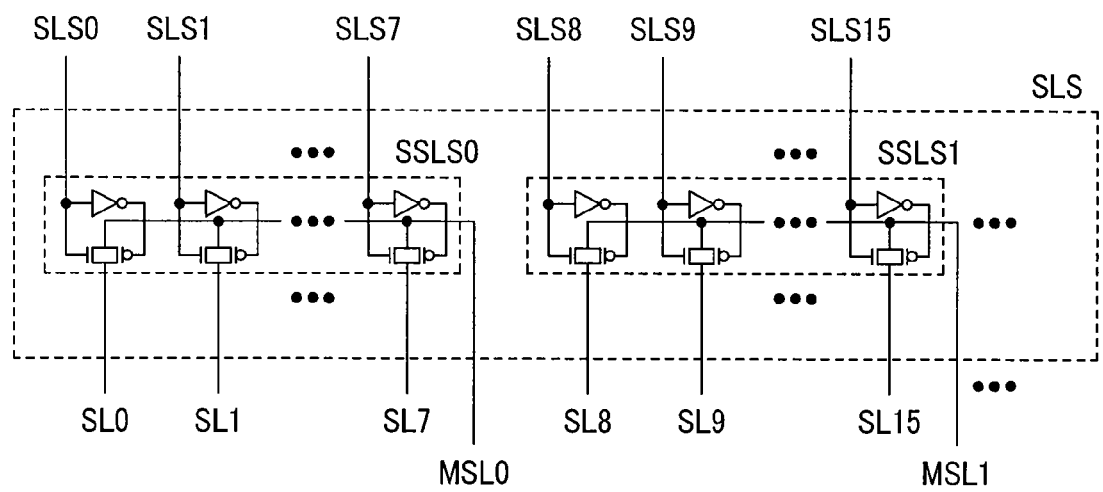

FIG. 14B shows one example of the configuration for the source line selector SLS circuit shown in FIG. 7. When the source line selector SLS is selected by the source line decoder SDEC, the source line SL connected to a corresponding sub-source line selector SSLS is selected and connected to the main source line MSL. In this example, one main source line MSL is selected for eight source lines SL. Here, the number of source lines SL is not limited to 8, so a variety of numbers such as 4, 2, 16, etc., can be considered. This configuration is suitable for the multi-bit rewrite at once.

Figure 15:
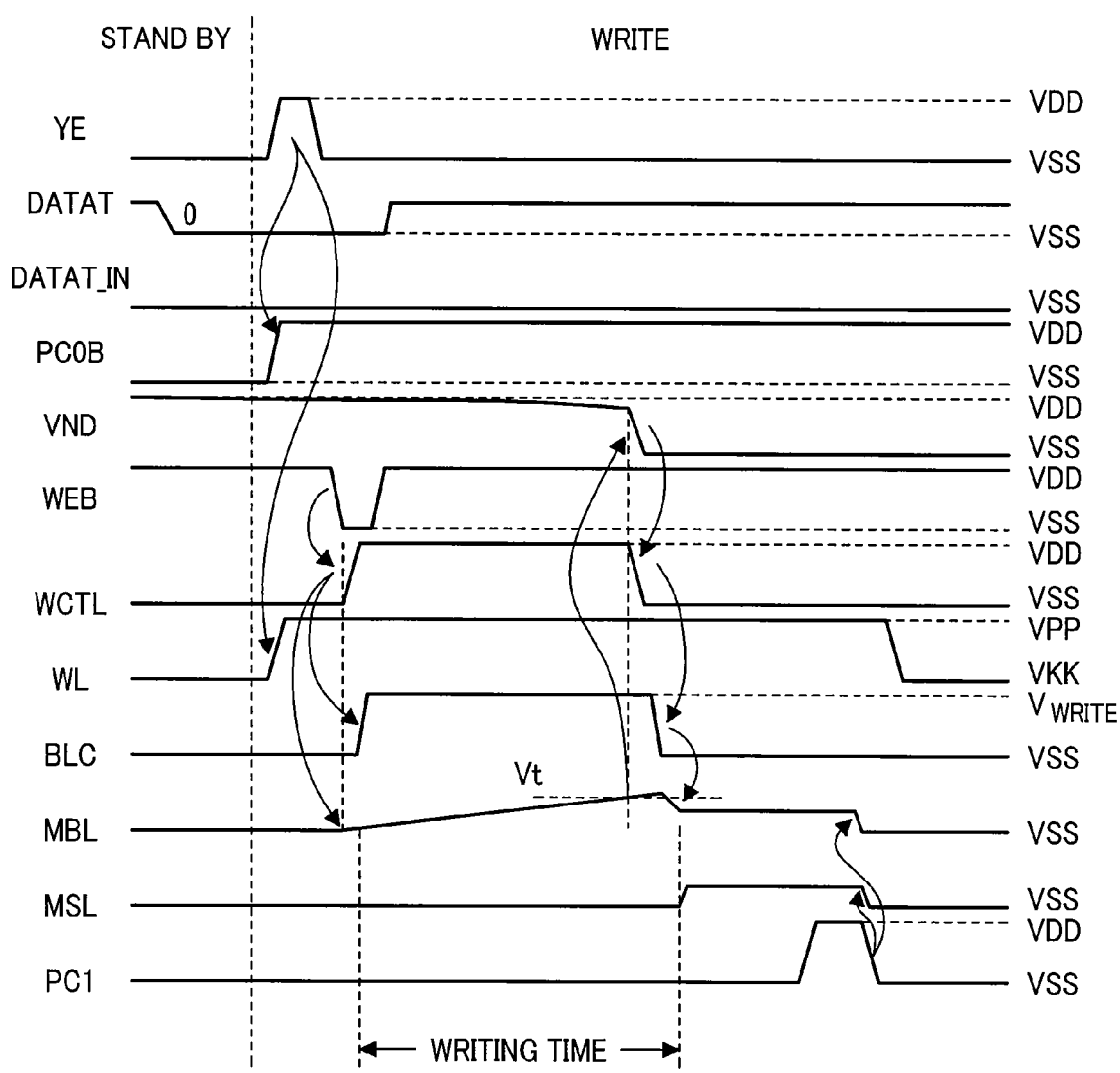
FIG. 15 shows a timing chart for the circuit of FIG. 7, in the case of writing data "0" on a memory cell where data "1" is stored.

FIG. 15 shows a timing chart for the circuit of FIG. 7, in which data "0" is written on a memory cell where data "1" is stored.

In standby mode, PCB0B is an active Low signal, and the verify node VND in the sense amplifier is driven to VDD during that time. While VND is being driven to VDD, VSS is controlled under a write control signal WCTL. For writing "0", DATAT is driven to VSS by the periphery control circuit. The operation waveform until DATAT is driven to VSS is similar to that of the typical DRAM, so it will be omitted here.

The subsequent operations will now be explained. When a Y address is confirmed by the Y decoder and the YE signal goes High, DATAT_IN is driven to VSS, the voltage corresponding to "0". Since write data is kept by the data latch circuit DLCH, YE should not be in high all the time during the write operation. DATAB and DATAB_IN are inverted signals of DATAT and DATAT_IN, respectively, and have distinct waveforms and voltage levels which are not necessary to be explained here. The precharge signal PC0B goes High from Low synchronously with YE becoming High. When PC0B goes High, VND becomes a floating node and the precharge VDD is achieved. Also, the word line WL changes from VKK, a negative voltage lower than VSS, to VPP, a positive voltage higher than VDD, synchronously with YE becoming High.

When the active Low signal WEB becomes Low, the potential at WCTL, the output node of the latch circuit LCT, goes High and stays High even after WEB becomes High. While WCTL is being High, the bit line driver BD and the source line driver SD are switched on. Thus, the write operation is continued as the write voltage Vwrite is impressed to the main bit line control MBLC by BD, and VSS is impressed to the main source line MSL by SD.

If "1", is stored in the memory cell, since the resistance value of the memory cell is much smaller than the resistance value of the reference load circuit REF, the potential at the MBL determined by resistance division between the memory cell and REF is close to VSS, yet smaller than Vt, the ON voltage of the sense amplifier SA. Therefore, Vwrite is supplied to BLC continuously, and the write operation is continued without ceasing.

The following will now explain how to end the write operation when the memory device is in high resistive state. If the resistance of the memory device increases by 1 digit or more, the potential at MBL determined by resistance division between the memory cell and the reference load circuit goes up above Vt. At this time, the switch of SA is turned on, and the potential at the verify node VND becomes VSS. When the potential at VND becomes VSS, WCTL becomes VSS, and therefore the potential at BLC becomes VSS. If BLC becomes VSS, the potential at MBL becomes VSS and the write operation stops. The precharge signal PCI becomes ON after a sufficient amount of time elapses after the end of the write operation, and it gets rid of all remaining charges at MBL and MSL. The actual amount of time taken to rewrite data on the memory cell is the duration indicated by the arrow.

Figure 16:
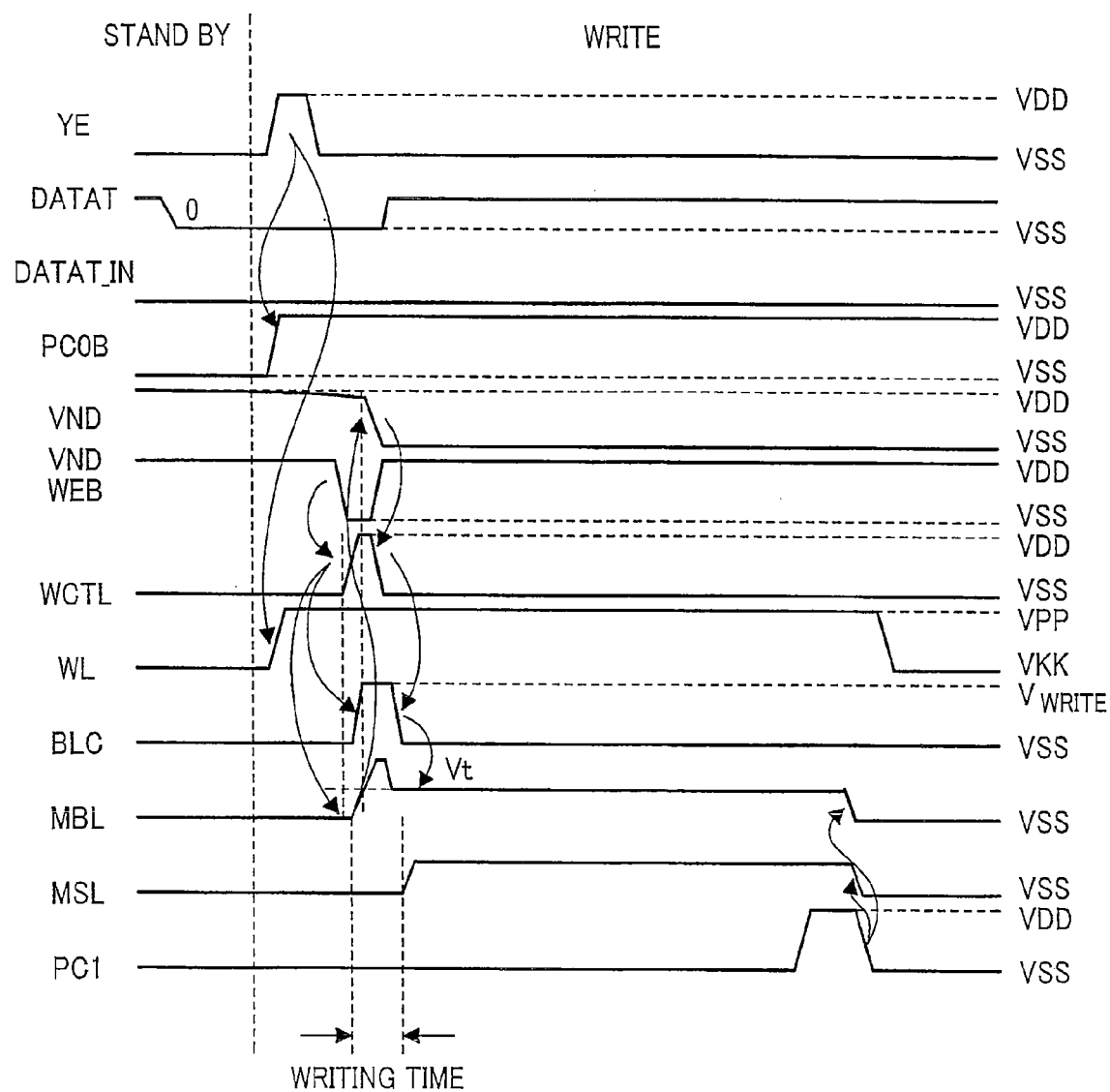
FIG. 16 shows a timing chart of the circuit of FIG. 7, in the case of writing data "0" on a memory cell where data "0" is stored.

FIG. 16 shows a timing chart for the circuit of FIG. 7, in which data "0" is written on a memory cell where data "0" is stored.

In standby mode, PCB0B is an active Low signal, and the verify node VND in the sense amplifier is driven to VDD during that time. While VND is being driven to VDD, VSS is controlled under a write control signal WCTL. For writing "0", DATAT is driven to VSS by the periphery control circuit. The operation waveform until DATAT is driven to VSS is similar to that of the typical DRAM, so it will be omitted here.

The subsequent operations will now be explained. When a Y address is confirmed by the Y decoder and the YE signal goes High, DATAT_IN is driven to VSS, the voltage corresponding to "0". Since write data is kept by the data latch circuit DLCH, YE should not be in high all the time during the write operation. DATAB and DATAB_IN are inverted signals of DATAT and DATAT_IN, respectively, and have distinct waveforms and voltage levels which are not necessary to be explained here. The precharge signal PC0B goes High from Low synchronously with YE becoming High. When PC0B goes High, VND becomes a floating node and the precharge VDD is achieved. Also, the word line WL changes from VKK, a negative voltage lower than VSS, to VPP, a positive voltage higher than VDD, synchronously with YE becoming High. When the active Low signal WEB becomes Low, the potential at WCTL, the output node of the latch circuit LCT, goes High and stays High even after WEB becomes High. While WCTL is being High, the bit line driver BD and the source line driver SD are switched on. Thus, the write operation is continued as the write voltage Vwrite is impressed to the main bit line control MBLC by BD, and VSS is impressed to the main source line MSL by SD.

If "0" is stored in the memory cell, since the resistance value of the memory cell is much larger than the resistance value of the reference load circuit REF, the potential at the MBL determined by resistance division between the memory cell and REF is greater than Vt, the ON voltage of the sense amplifier SA, from the beginning of the rewrite operation. Thus, Vwrite supply to BLC is interrupted within a very short period of time, and the switch of SA is turned on. As a result, the potential at VND becomes VSS. When the potential at VND becomes VSS, WCTL becomes VSS, and Vwrite supply to BLC is stopped, causing the write operation to end. The precharge signal PCI becomes ON after a sufficient amount of time elapses after the end of the write operation, and it gets rid of all remaining charges at MBL and MSL. The actual amount of time taken to rewrite data on the memory cell is indicated by the arrow. The duration is shortened to a great deal because overwrites are avoided.

Figure 17:
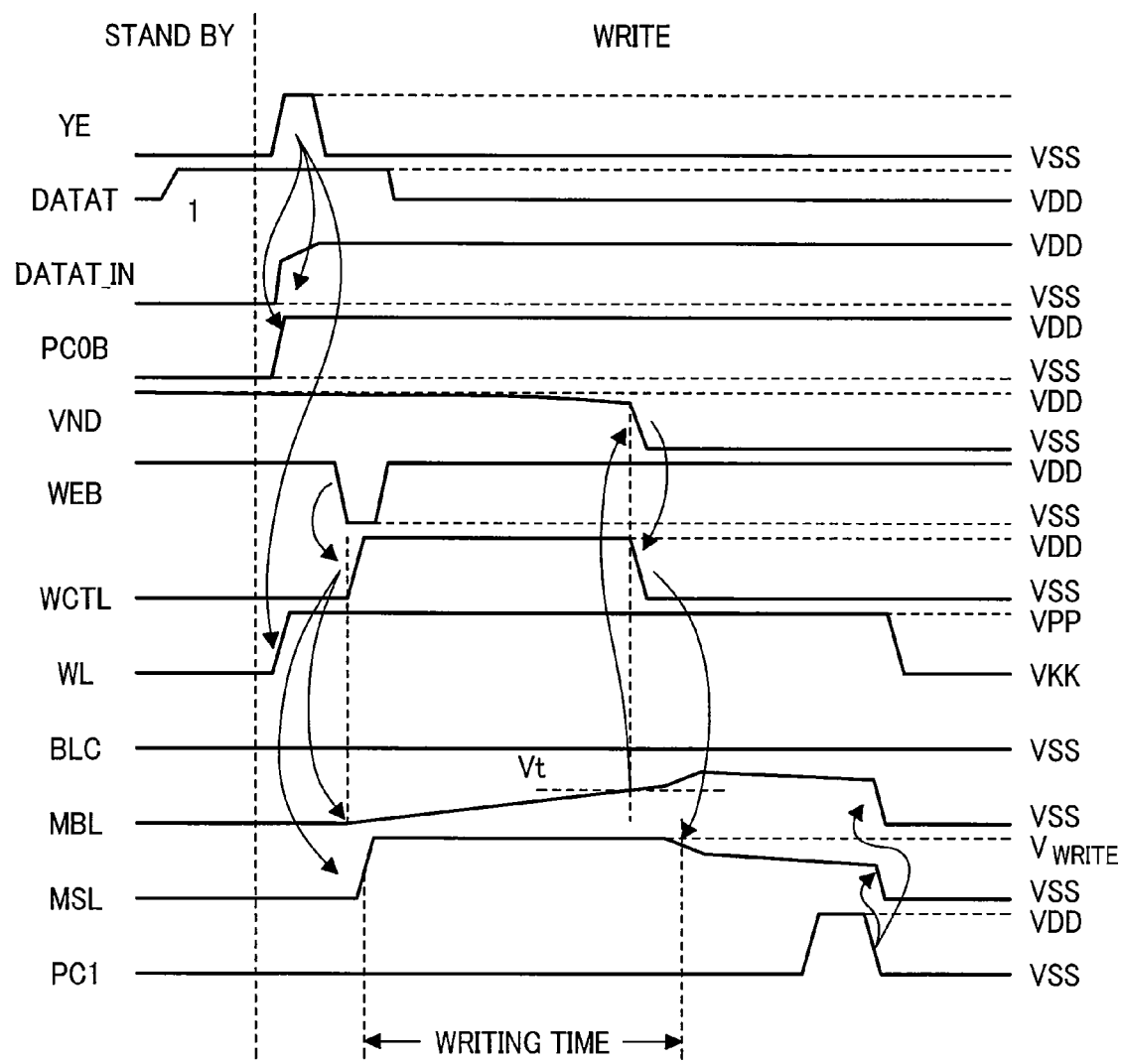
FIG. 17 shows a timing chart of the circuit of FIG. 7, in the case of writing data "1" on a memory cell where data "0" is stored.

FIG. 17 shows a timing chart for the circuit of FIG. 7, in which data "1" is written on a memory cell where data "0" is stored.

In standby mode, PCB0B is an active Low signal, and the verify node VND in the sense amplifier is driven to VDD during that time. While VND is being driven to VDD, VSS is controlled under a write control signal WCTL. For writing "1", DATAT is driven to VSS by the periphery control circuit. The operation waveform until DATAT is driven to VSS is similar to that of the typical DRAM, so it will be omitted here.

The subsequent operations will now be explained. When a Y address is confirmed by the Y decoder and the YE signal goes High, DATAT_IN is driven to VDD, the voltage corresponding to "1". Since write data is kept by the data latch circuit DLCH, YE need not be in high all the time during the write operation. DATAB and DATAB_IN are inverted signals of DATAT and DATAT_IN, respectively, and have distinct waveforms and voltage levels which are not necessary to be explained here. The precharge signal PC0B goes High from Low synchronously with YE becoming High. When PC0B goes High, VND becomes a floating node and the precharge VDD is achieved. Also, the word line WL changes from VKK, a negative voltage lower than VSS, to VPP, a positive voltage higher than VDD, synchronously with YE becoming High. When the active Low signal WEB becomes Low, the potential at WCTL, the output node of the latch circuit LCT, goes High and stays High even after WEB becomes High. While WCTL is being High, the bit line driver BD and the source line driver SD are switched on. Thus, the write operation is continued as VSS is impressed to the main bit line control MBLC by BD, and the write voltage Vwrite is impressed to the main source line MSL by SD.

If "0" is stored in the memory cell, since the resistance value of the memory cell is much larger than the resistance value of the reference load circuit REF, the potential at the MBL determined by resistance division between the memory cell and REF is close to VSS, yet smaller than Vt, the ON voltage of the sense amplifier SA. Therefore, Vwrite is supplied to SL continuously, and the write operation is continued without ceasing.

When the write operation on the memory device is completed, the resistance of the memory device decreases by 1 digit or more. As a result, the potential at MBL determined by resistance division between the memory cell and the reference load circuit goes up above Vt. At this time, the switch of SA is turned on, and the potential at the verify node VND becomes VSS. When the potential at VND becomes VSS, WCTL becomes VSS. Accordingly, the Vwrite supply to MSL is interrupted and the write operation stops. The precharge signal PCI becomes ON after a sufficient amount of time elapses after the end of the write operation, and it gets rid of all remaining charges at MBL and MSL.

Figure 18:
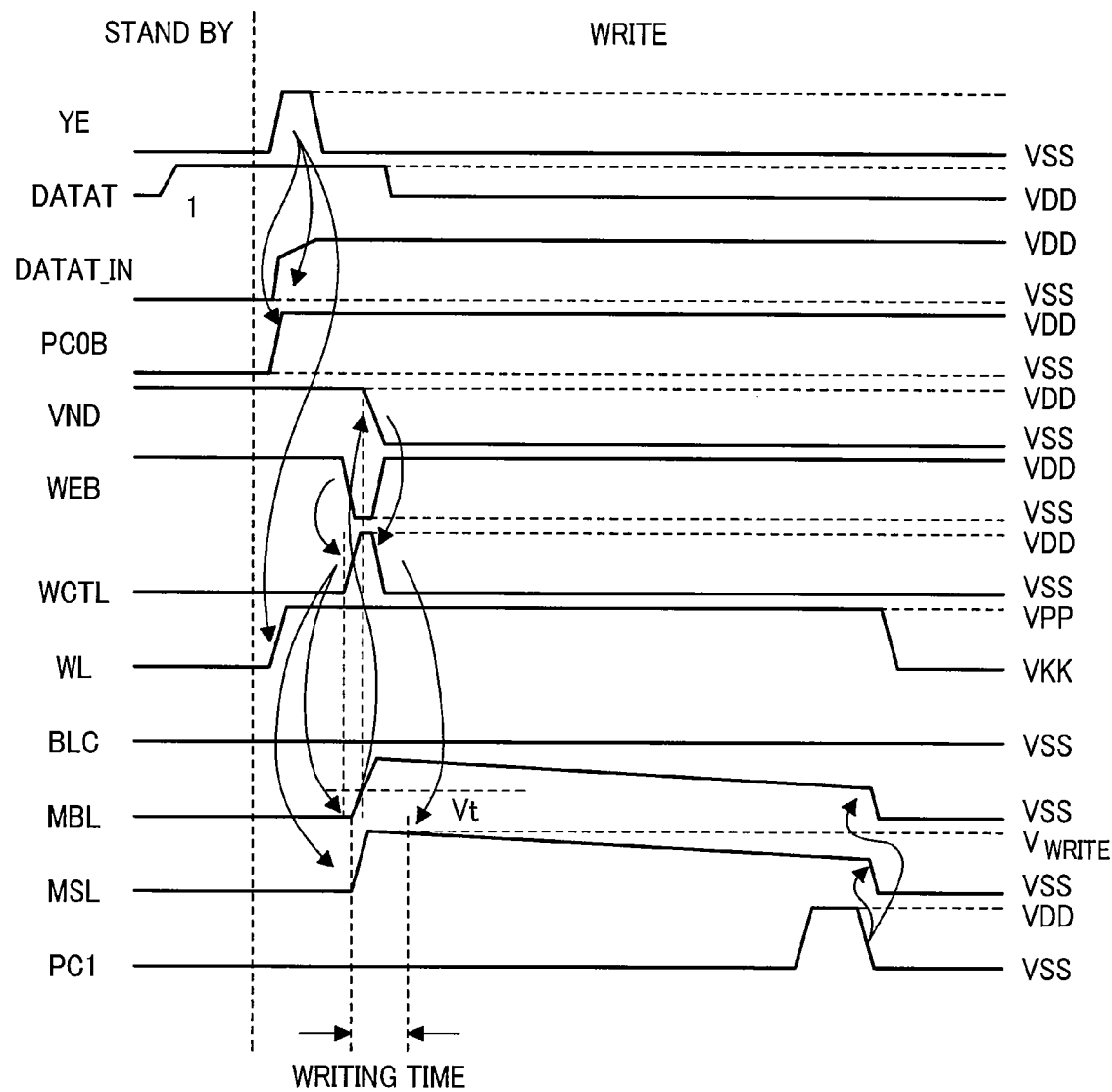
FIG. 18 shows a timing chart of the circuit of FIG. 7, in the case of writing data "1" on a memory cell where data "1", is stored.

FIG. 18 shows a timing chart for the circuit of FIG. 7, in which data "1" is written on a memory cell where data "1" is stored.

In standby mode, PCB0B is an active Low signal, and the verify node VND in the sense amplifier is driven to VDD during that time. While VND is being driven to VDD, VSS is controlled under a write control signal WCTL. For writing "1", DATAT is driven to VSS by the periphery control circuit. The operation waveform until DATAT is driven to VSS is similar to that of the typical DRAM, so it will be omitted here.

The subsequent operations will now be explained. When a Y address is confirmed by the Y decoder and the YE signal goes High, DATAT_IN is driven to VDD, the voltage corresponding to "1". Since write data is kept by the data latch circuit DLCH, YE should not be in high all the time during the write operation. DATAB and DATAB_IN are inverted signals of DATAT and DATAT_IN, respectively, and have distinct waveforms and voltage levels which are not necessary to be explained here. The precharge signal PC0B goes High from Low synchronously with YE becoming High. When PC0B goes High, VND becomes a floating node and the precharge VDD is achieved. Also, the word line WL changes from VKK, a negative voltage lower than VSS, to VPP, a positive voltage higher than VDD, synchronously with YE becoming High. When the active Low signal WEB becomes Low, the potential at WCTL, the output node of the latch circuit LCT, goes High and stays High even after WEB becomes High. While WCTL is being High, the bit line driver BD and the source line driver SD are switched on. Thus, the write operation is continued as VSS is impressed to the main bit line control MBLC by BD, and the write voltage Vwrite is impressed to the main source line MSL by SD.

If "1" is stored in the memory cell, since the resistance value of the memory cell is much smaller than the resistance value of the reference load circuit REF, the potential at the MBL determined by resistance division between the memory cell and REF is greater than Vt, the ON voltage of the sense amplifier SA, from the beginning of the rewrite operation. Thus, Vwrite supply to SL is interrupted within a very short period of time, and the switch of SA is turned on. As a result, the potential at VND becomes VSS. When the potential at VND becomes VSS, WCTL becomes VSS, and Vwrite supply to SL is stopped, causing the write operation to end. The precharge signal PCI becomes ON after a sufficient amount of time elapses after the end of the write operation, and it gets rid of all remaining charges at MBL and MSL. The actual amount of time taken to rewrite data on the memory cell is indicated by the arrow. The duration is shortened to a great deal because overwrites are avoided.

Figure 19A:
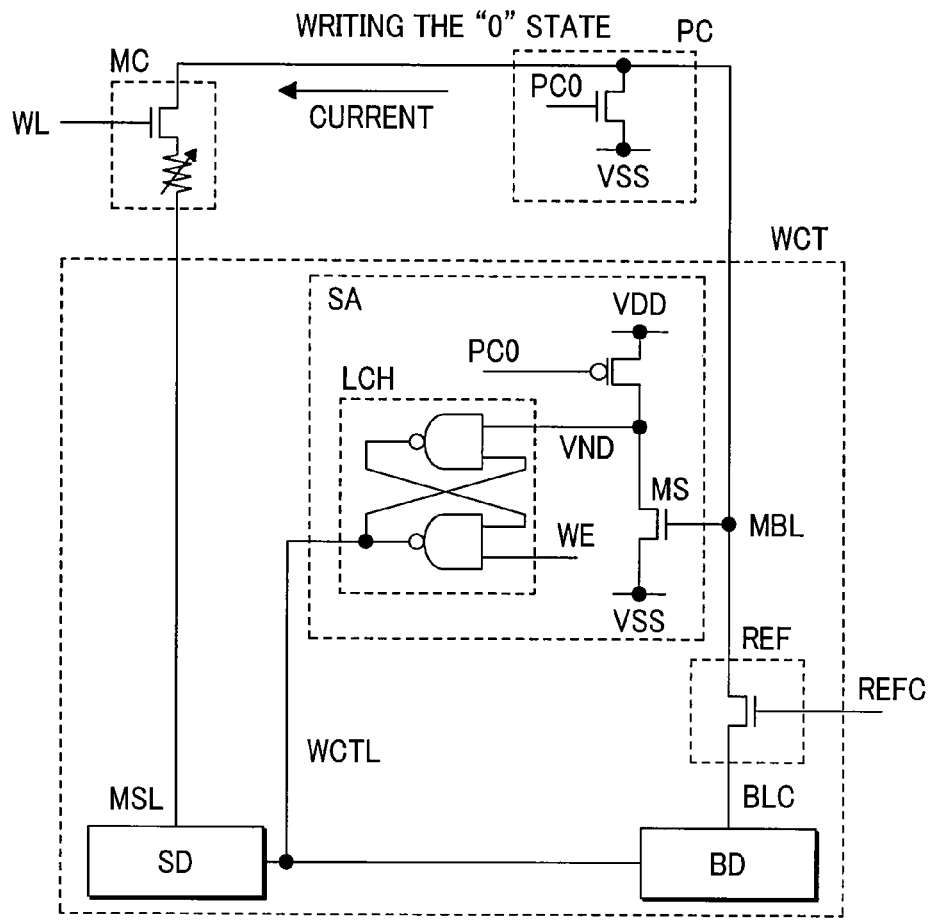
FIGS. 19A through 19C show, respectively, operation explanatory views in the case of writing a "0" state.

FIG. 19A shows circuit elements involved in the "0" write operation illustrated in FIGS. 15 and 16. The direction of current is indicated by the arrow in the drawing.

Figure 19B:
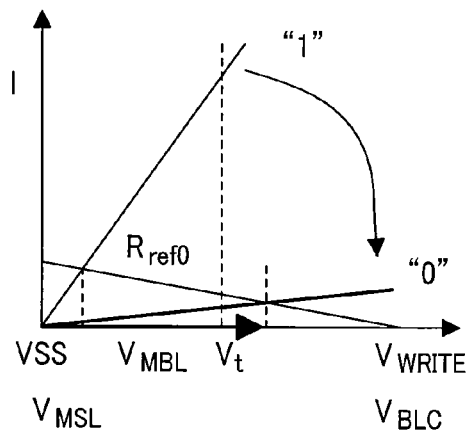

FIG. 19B shows the variation in potential VMBL at the node MBL for the circuit shown in FIG. 19A, if data is rewritten on the memory cell from a "1" state to a "0" state. Rref0 denotes a resistance value of REF in the case of writing "0", VMSL denotes a potential at MSL, VBLC denotes a potential at BLC, and Vt denotes a threshold voltage of MS included in the SA. In the case of writing "0", VMSL=VSS and VBLC=Vwrite are impressed by SD and BD, respectively. Once the rewrite operation from "1" to "0" has started, VMBL becomes the potential that is determined at the intersection point between the straight line "1" and the straight line Rref0. When the rewrite operation on the memory cell is completed, VMBL becomes the potential that is determined at the intersection point between the straight line "0" and the straight line Rref0. At this time, VMBL crosses the Vt level, MS becomes ON to stop the write operation.

Figure 19C:
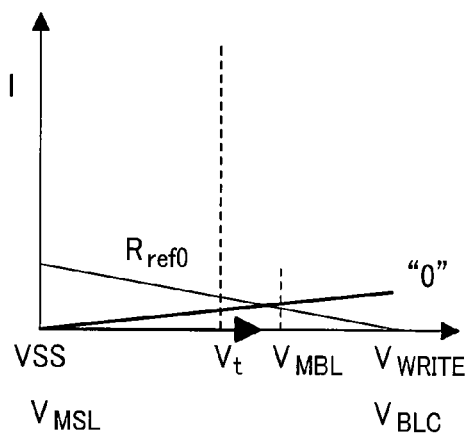

FIG. 19C shows which level a potential VMBL at the node MBL for the circuit shown in FIG. 19A can reach, if "0" is written on the memory cell in a "0" state. Since VMBL exceeded Vt immediately after the write operation started, MS becomes ON at once to stop the write operation.

Figure 20A:
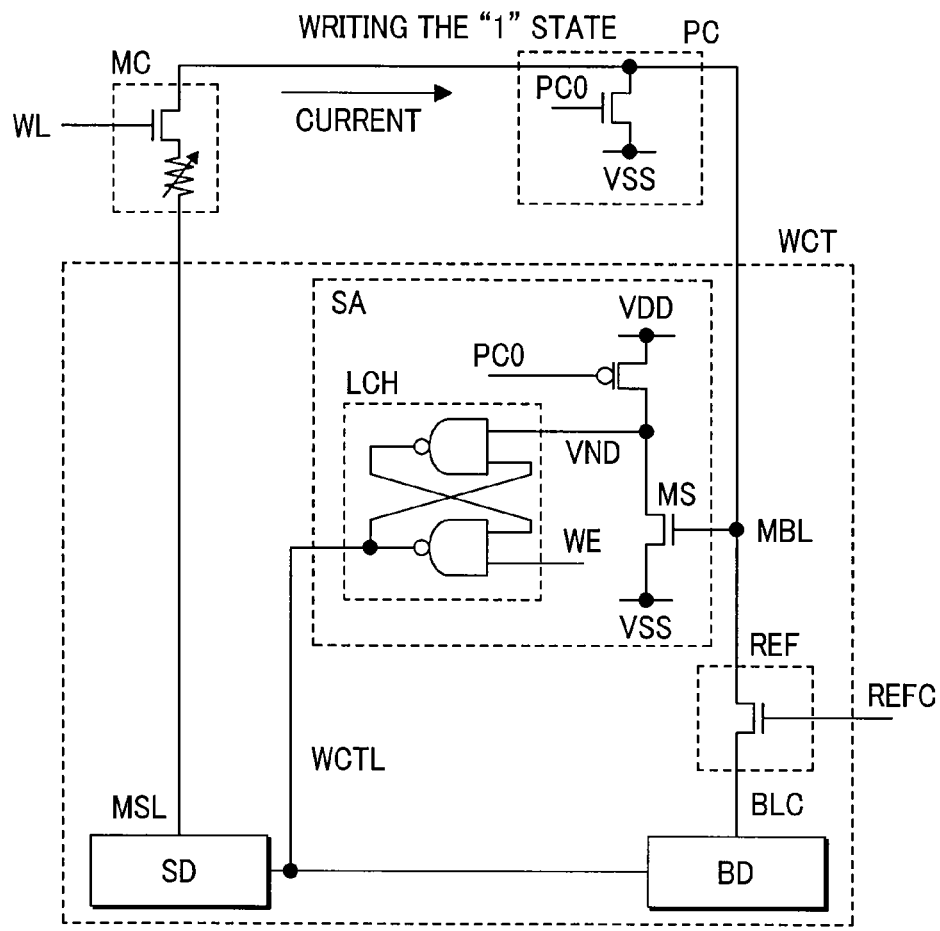
FIGS. 20A through 20C show, respectively, operation explanatory views in the case of writing a "1" state.

FIG. 20A shows circuit elements involved in the "1" write operation illustrated in FIGS. 17 and 18. The direction of current is indicated by the arrow in the drawing.

Figure 20B:
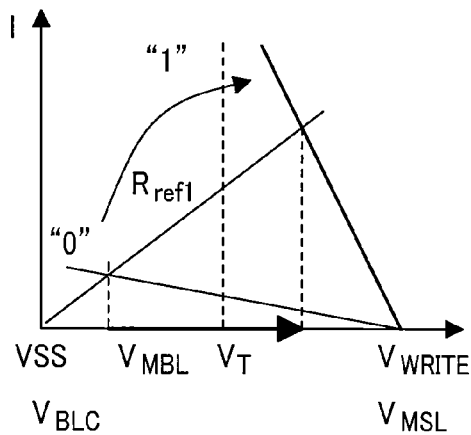

FIG. 20B shows the variation in potential VMBL at the node MBL for the circuit shown in FIG. 20A, if data is rewritten on the memory cell from a "0" state to a "1" state. Rref0 denotes a resistance value of REF in the case of writing "1", VMSL denotes a potential at MSL, VBLC denotes a potential at BLC, and Vt denotes a threshold voltage of MS included in the SA. In the case of writing "1", VMSL=Vwrite and VBLC=VSS are impressed by SD and BD, respectively. Once the rewrite operation from "0" to "1" has started, VMBL becomes the potential that is determined at the intersection point between the straight line "0" and the straight line Rref0. When the rewrite operation on the memory cell is completed, VMBL becomes the potential that is determined at the intersection point between the straight line "1" and the straight line Rref0. At this time, VMBL crosses the Vt level, MS becomes ON to stop the write operation.

Figure 20C:
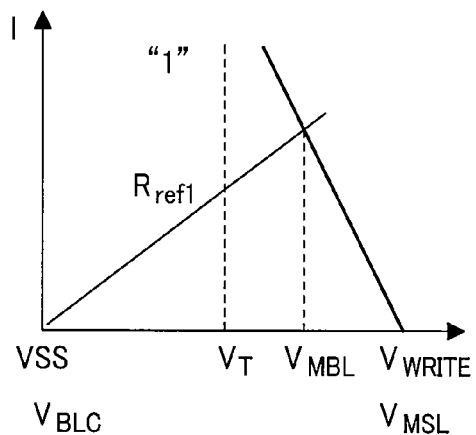

FIG. 20C shows which level a potential VMBL at the node MBL for the circuit shown in FIG. 20A can reach, if "1" is written on the memory cell in a "1" state. Since VMBL exceeded Vt immediately after the write operation started, MS becomes ON at once to stop the write operation.

Figure 22A:
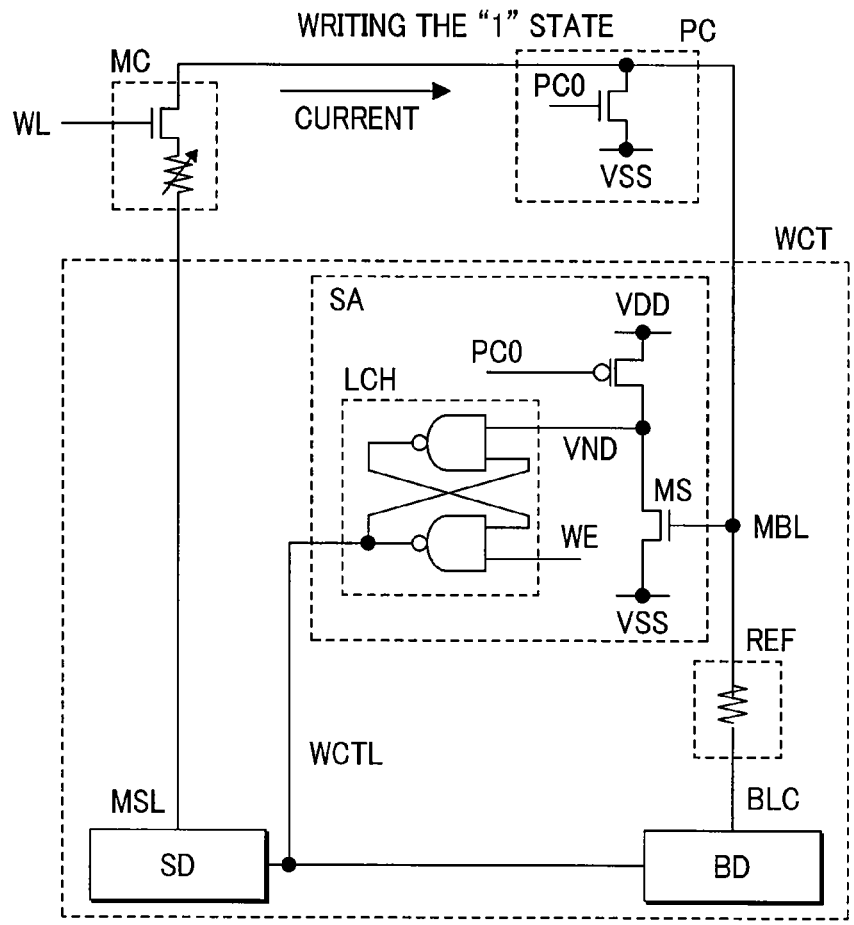
FIGS. 22A through 22C are operation explanatory views for the circuit in FIG. 7, in which a "1" state is written when the REF configuration of FIG. 11D is applied.
Figure 22B:
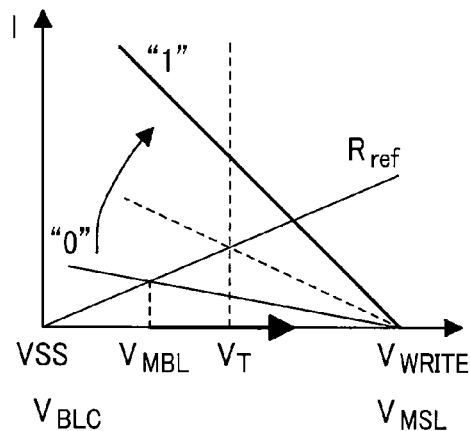
Figure 22C:
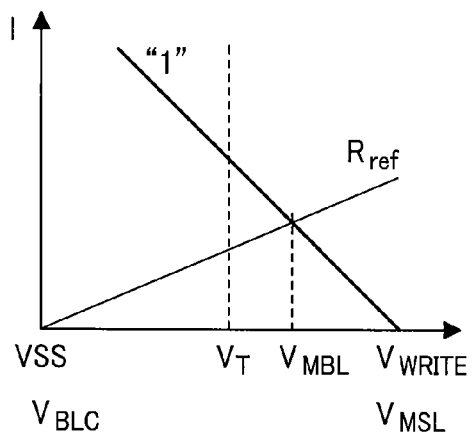

FIGS. 21A through 21C differ from FIGS. 19A through 19C in that the load of REF has a fixed resistance. This corresponds to a case where the rewrite operation is done under the condition of Ref0=Rref1=Rref in FIGS. 19B and 19C. FIGS. 22A through 22C differ from FIGS. 20A through 20C in that the load of REF has a fixed resistance. This corresponds to a case where the rewrite operation is done under the condition of Ref0=Rref1=Rref in FIGS. 20B and 20C.

Figure 23:
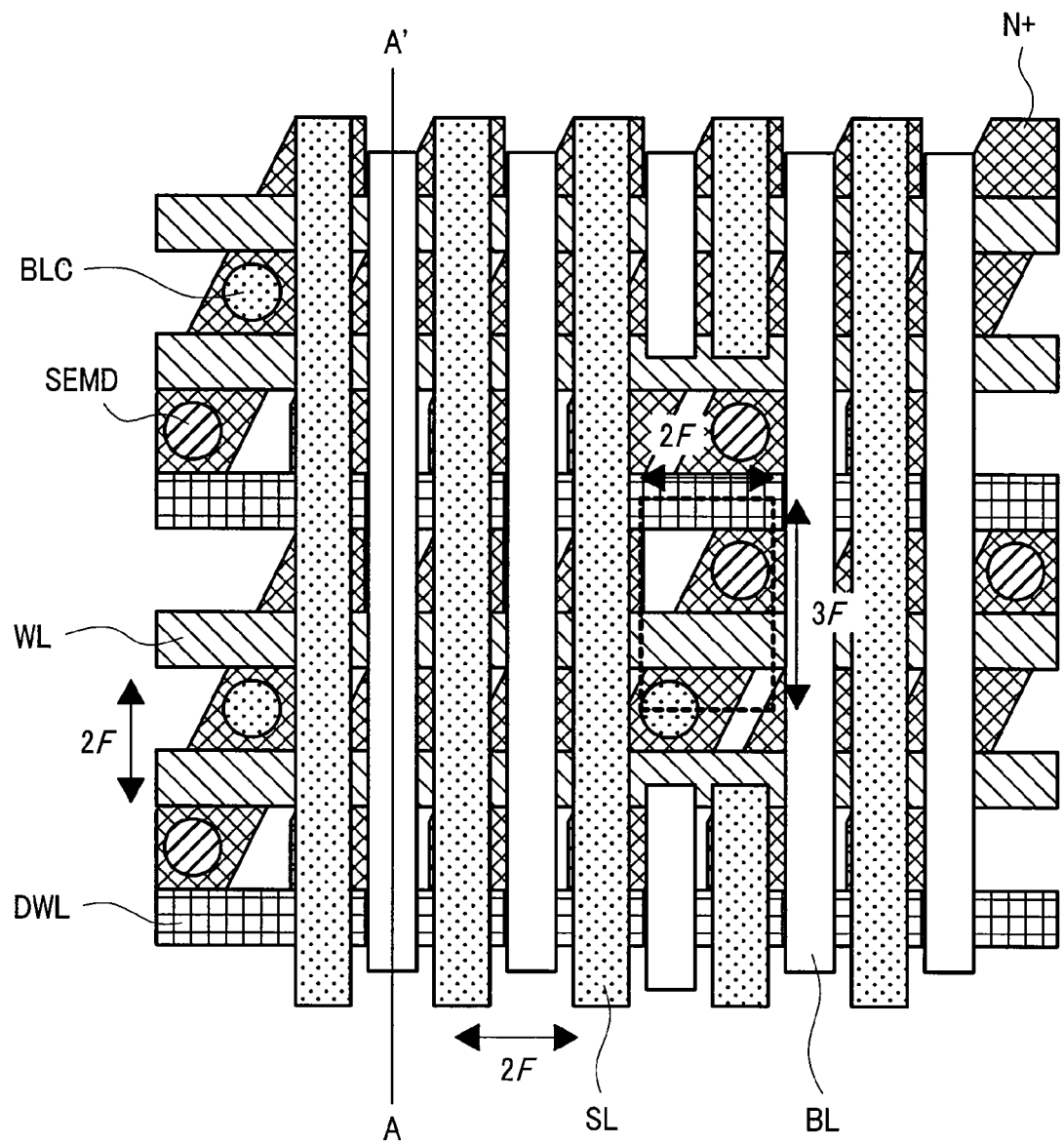
FIG. 23 shows an example of a memory array layout.

FIG. 23 shows an example of the layout for the memory array MCA, which corresponds to the circuit diagram of the memory cell array shown in FIG. 9. A dummy word line DWL is provided for every two word lines WL. As such, the mask of a diffusion layer N+can be made simpler. The bit line contact BLC is shared with an adjacent memory cell that does not share the word line WL and the dummy word line DWL. The bit line BL and the source line SL are designed to be in parallel to each other, yet they have different layer heights. The portion enclosed with a dotted rectangle represents a 1-bit memory cell MC, and its area equals to $6F^2$, F being a process node. A latest DRAM also has a cell area of $6F^2$. However, the resistance variable memory device is easier to fabricate than the capacitor of DRAM, so a 1T1R memory can be fabricated even by the micro process known for being difficult or not suitable for fabricating a 1T1C type DRAM.

FIGS. 24A through 24C illustrates cross-sectional views of the memory array MCA, taken along line A-A' in FIG. 23. In detail, FIG. 24A shows that the bit line BL is laid out above the source line SL, and FIG. 24B shows that the bit line BL is a layer below the source line SL, that is, the resistance variable memory device is disposed at a layer above the bit line BL. FIG. 24C shows that the bit line BL is a layer below the source line SL, that is, the resistance variable memory device is disposed at a layer below the bit line BL. One can believe that the structure shown in FIG. 24B may increase product yield because it takes less fabrication processes at the layer above the resistance variable memory device.

The semiconductor memory device of the present invention can be advantageously used especially for a solid electrolyte memory, but it can also be applied to an on-chip-memory such as a microprocessor or a DSP (Digital Signal Processor) built in a logic tip chip.

What is claimed is:

1. A semiconductor memory device, comprising:
    a memory array having a plurality of bit lines, a plurality of word lines, a plurality of source lines, and memory cells arranged at respective intersections between the plurality of word lines and the plurality of bit lines;
    a bit line selector circuit connected to the plurality of bit lines;
    a sense amplifier connected to the bit line selector circuit;
    a precharge circuit connected to the bit line selector circuit;
    a bit line driver circuit connected to the bit line selector circuit;
    a reference load circuit connected to the bit line selector circuit, and connected between the bit line selector circuit and the bit line driver circuit in series;
    a source line selector circuit connected to the plurality of source lines; and
    a source line driver circuit connected to the source line selector circuit.

2. The semiconductor memory device according to claim 1, wherein when inverted data is written into at least one of the memory cells, the sense amplifier detects whether a potential at an intermediate node between the memory cell and the reference load circuit increases at the completion of writing the inverted data, so as to stop operations of the bit line driver and the source line driver.

3. The semiconductor memory device according to claim 2, wherein a threshold voltage of an NMOS transistor is used as a reference of means for detecting whether a potential at an intermediate node between the memory cell and the reference load circuit increases, and
    wherein the threshold voltage is set to a level between a voltage at the bit line driver and a voltage at the source line driver.

4. The semiconductor memory device according to claim 1, wherein a low resistive state and a high resistive state are written, based on a direction of current flowing to the memory cell.

5. The semiconductor memory device according to claim 4, wherein a threshold voltage of an NMOS transistor is used as a reference of means for detecting whether a potential at an intermediate node between the memory cell and the reference load circuit increases, and
    wherein, the threshold voltage is set to a level between a voltage at the bit line driver and a voltage at the source line driver.

6. The semiconductor memory device according to claim 1, wherein in the case of overwriting the same data as data already written on the memory cell, the sense amplifier detects whether a potential at an intermediate node between the memory cell and the reference load circuit increases before the overwrite, so as to stop operations of the bit line driver and the source line driver.

7. The semiconductor memory device according to claim 1, wherein the memory cell stores data based on variation in resistance, and
    wherein a low resistive state of the memory cell and a high resistive state of the memory cell are different by at least one digit or more, the low resistive state designating a state where the memory cell has a low resistance value, the high resistive state designating a state where the memory cell has a high resistance value.

8. The semiconductor memory device according to claim 1, further comprising:
    data latch circuits connected to the bit line driver circuit and the source line driver circuit.

9. The semiconductor memory device according to claim 1, wherein the sense amplifier includes a latch circuit for maintaining a write enable state.

10. The semiconductor memory device according to claim 1, wherein the reference load circuit is controllable by a voltage.

11. The semiconductor memory device according to claim 1, wherein the precharge circuit removes accumulated charges at the bit line after the completion of rewriting.

12. A semiconductor memory device, comprising:
    a memory array having a plurality of bit lines, a plurality of word lines, a plurality of source lines, and memory cells arranged at respective intersections between the plurality of word lines and the plurality of bit lines;
    a bit line selector circuit connected to the bit line;
    a sense amplifier connected to a source line selector circuit;
    a precharge circuit connected to the source line selector circuit;
    a source line driver circuit connected to the source line selector circuit;
    a reference load circuit connected to the source line selector circuit, and connected between the bit line selector circuit and the source driver circuit in series; and
    a bit line driver circuit connected to the bit line selector circuit.

13. The semiconductor memory device according to claim 12, wherein if inverted data is written on the memory cell, the sense amplifier detects whether a potential at an intermediate node between the memory cell and the reference load circuit increases at the completion of writing the inverted data, so as to stop operations of the bit line driver and the source line driver.

14. The semiconductor memory device according to claim 13, wherein a threshold voltage of an NMOS transistor is used as a reference of means for detecting whether a potential at an intermediate node between the memory cell and the reference load circuit increases, and
    wherein the threshold voltage is set to a level between a voltage at the bit line driver and a voltage at the source line driver.

15. The semiconductor memory device according to claim 12, wherein a low resistive state and a high resistive state are written, based on a direction of current flowing to the memory cell.

16. The semiconductor memory device according to claim 15, wherein a threshold voltage of an NMOS transistor is used as a reference of means for detecting whether a potential at an intermediate node between the memory cell and the reference load circuit increases, and
    wherein, the threshold voltage is set to a level between a voltage at the bit line driver and a voltage at the source line driver.

17. The semiconductor memory device according to claim 12, wherein in the case of overwriting the same data as data already written on the memory cell, the sense amplifier detects whether a potential at an intermediate node between the memory cell and the reference load circuit increases before the overwrite, so as to stop operations of the bit line driver and the source line driver.

18. The semiconductor memory device according to claim 12, further comprising:
  data latch circuits connected to the bit line driver circuit and the source line driver circuit.

* * * * *